United States Patent
Munoz

(10) Patent No.: US 12,379,351 B2
(45) Date of Patent: *Aug. 5, 2025

(54) INTERNET OF THINGS (IoT) ENABLED WIRELESS SENSOR SYSTEM ENABLING PROCESS CONTROL, PREDICTIVE MAINTENANCE OF ELECTRICAL DISTRIBUTION NETWORKS, LIQUID AND GAS PIPELINES AND MONITORING OF AIR POLLUTANTS INCLUDING NUCLEAR, CHEMICAL, AND BIOLOGICAL AGENTS USING ATTACHED AND/OR EMBEDDED PASSIVE ELECTROMAGNETIC SENSORS

(71) Applicant: Michael Munoz, Dayton, MT (US)

(72) Inventor: Michael Munoz, Dayton, MT (US)

(*) Notice: Subject to any disclaimer, the term of this patent is extended or adjusted under 35 U.S.C. 154(b) by 283 days.

This patent is subject to a terminal disclaimer.

(21) Appl. No.: 17/199,150

(22) Filed: Mar. 11, 2021

(65) Prior Publication Data

US 2021/0202113 A1 Jul. 1, 2021

Related U.S. Application Data

(63) Continuation of application No. 16/768,669, filed as application No. PCT/US2018/063394 on Nov. 30, 2018.

(Continued)

(51) Int. Cl.
*G01N 29/11* (2006.01)
*G01H 11/08* (2006.01)
(Continued)

(52) U.S. Cl.
CPC ............ *G01N 29/11* (2013.01); *G01H 11/08* (2013.01); *G01N 29/2481* (2013.01);
(Continued)

(58) Field of Classification Search
CPC .. H04Q 9/00; H04Q 2209/00; H04Q 2209/10; H04Q 2209/40; H04Q 2209/43;
(Continued)

(56) References Cited

U.S. PATENT DOCUMENTS 7,129,828 B2   10/2006   Cook
7,528,711 B2 *  5/2009   Kates .................. G08B 25/009
                                                340/505

(Continued)

FOREIGN PATENT DOCUMENTS

JP      2006170864 A    6/2006
JP      2008204234 A    9/2008

OTHER PUBLICATIONS

SAS, The Autonomous Grid: "Machine Learning and IoT for Utilities," Apr. 2016.

(Continued)

*Primary Examiner* — Franklin D Balseca
(74) *Attorney, Agent, or Firm* — Mitchell J. W. Vap

(57) ABSTRACT

The invention relates generally to an Internet of Things (IoT) enabled wireless sensor system using attached and/or embedded passive electromagnetic sensors (PES) with distribution hardware. One embodiment of this invention includes a wireless sensor system, which permits process control and predictive maintenance on a utility's electrical transmission and distribution grid. Another embodiment includes a wireless sensor system, which permits process control and predictive maintenance of liquid or gas through a pipeline. Another embodiment includes a wireless sensor system, which permits measurement of breathable air pollutants. Furthermore, a method of manufacturing a protective passive electromagnetic sensor pod and passive electromagnetic sensor equipped distribution hardware components is provided.

7 Claims, 24 Drawing Sheets

Related U.S. Application Data

(60) Provisional application No. 62/655,643, filed on Apr. 10, 2018, provisional application No. 62/655,653, filed on Apr. 10, 2018, provisional application No. 62/626,247, filed on Feb. 5, 2018, provisional application No. 62/624,493, filed on Jan. 31, 2018, provisional application No. 62/596,492, filed on Dec. 8, 2017, provisional application No. 62/592,652, filed on Nov. 30, 2017.

(51) Int. Cl.
| | |
|---|---|
| *G01N 29/036* | (2006.01) |
| *G01N 29/24* | (2006.01) |
| *G01R 31/50* | (2020.01) |
| *G16Y 10/35* | (2020.01) |
| *G16Y 30/00* | (2020.01) |
| *G16Y 40/10* | (2020.01) |
| *G16Y 40/35* | (2020.01) |
| *H04L 67/12* | (2022.01) |
| *H04Q 9/00* | (2006.01) |
| *H04W 84/18* | (2009.01) |

(52) U.S. Cl.
CPC ............. *G16Y 10/35* (2020.01); *G16Y 30/00* (2020.01); *G16Y 40/10* (2020.01); *G16Y 40/35* (2020.01); *H04L 67/12* (2013.01); *H04Q 9/00* (2013.01); *H04W 84/18* (2013.01); *G01N 29/036* (2013.01); *G01N 2291/0215* (2013.01); *G01N 2291/02845* (2013.01); *G01N 2291/02863* (2013.01); *G01N 2291/02872* (2013.01); *G01N 2291/02881* (2013.01); *G01R 31/50* (2020.01)

(58) Field of Classification Search
CPC ........... H04Q 2209/47; H04Q 2209/70; H04Q 2209/80; H04Q 2209/82; H04Q 2209/84; G01N 29/11; G01N 29/2481; G01N 29/036; G01N 2291/0215; G01N 2291/02845; G01N 2291/02863; G01N 2291/02872; G01N 2291/02881; G16Y 40/10; G16Y 40/35; G16Y 30/00; G16Y 10/35; G01H 11/08; H04L 67/12; H04W 84/18; G01R 31/50

See application file for complete search history.

(56) References Cited

U.S. PATENT DOCUMENTS

| | | | |
|---|---|---|---|
| 8,384,524 B2 * | 2/2013 | Cobianu | G06K 19/0672 340/5.1 |
| 8,552,597 B2 * | 10/2013 | Song | H02J 50/001 307/104 |
| 8,670,782 B2 * | 3/2014 | Hampapur | H04W 24/08 714/25 |
| 8,718,833 B2 * | 5/2014 | McMullin | H02J 3/144 700/292 |
| 9,204,208 B2 * | 12/2015 | Hurri | H04Q 9/00 |
| 9,513,174 B2 * | 12/2016 | Henig | G01R 15/146 |
| 9,778,286 B2 | 10/2017 | Gouzman et al. | |
| 10,390,759 B2 * | 8/2019 | Quinn | A61B 5/002 |
| 2001/0018847 A1 | 9/2001 | Lynam | |
| 2005/0113964 A1 | 5/2005 | Van Der Meulen | |
| 2005/0273218 A1 | 12/2005 | Breed et al. | |
| 2006/0097335 A1 | 5/2006 | Kim et al. | |
| 2007/0208390 A1 | 9/2007 | Von Arx et al. | |
| 2010/0199777 A1 | 8/2010 | Hooper | |
| 2011/0118753 A1 | 5/2011 | Itkowitz | |
| 2013/0043887 A1 | 2/2013 | Siolkowski et al. | |
| 2015/0117157 A1 | 4/2015 | Li et al. | |
| 2016/0048757 A1 | 2/2016 | Nasle et al. | |
| 2016/0209454 A1 | 7/2016 | McCammon et al. | |
| 2016/0261312 A1 | 9/2016 | Fuchs et al. | |
| 2017/0011612 A1 | 1/2017 | Jain | |
| 2017/0123428 A1 | 5/2017 | Levinson et al. | |
| 2018/0017602 A1 | 1/2018 | Gavrilov et al. | |
| 2021/0174973 A1 * | 6/2021 | Munoz | H04Q 9/00 |

OTHER PUBLICATIONS

IEEE, "Big Data Analytics in the Smart Grid," White Paper #1—Draft, IEEE, date of publication unknown, www.smartgrid.ieee.org.

Galindo-Romera, Gabriel et al., "An IoT Reader for Wireless Passive Electromagnetic Sensors," Sensors, MDPI, Mar. 28, 2017, Madrid Spain.

Communication under Rule 71(3) EPC, Intention to grant, EPO, Sep. 15, 2023.

\* cited by examiner

INTERNET OF THINGS (IoT) ENABLED WIRELESS SENSOR SYSTEM ENABLING PROCESS CONTROL, PREDICTIVE MAINTENANCE OF ELECTRICAL DISTRIBUTION NETWORKS, LIQUID AND GAS PIPELINES AND MONITORING OF AIR POLLUTANTS INCLUDING NUCLEAR, CHEMICAL, AND BIOLOGICAL AGENTS USING ATTACHED AND/OR EMBEDDED PASSIVE ELECTROMAGNETIC SENSORS

CROSS REFERENCE TO RELATED APPLICATIONS

This continuing application claims the benefit of U.S. Non-provisional application Ser. No. 16/768,669 filed on May 30, 2020 which is a U.S. national stage entry from PCT application No. PCT/US18/63394 filed on Nov. 30, 2018, which claims the benefit of U.S. Provisional Application No. 62/655,653 filed on Apr. 10, 2018; U.S. Provisional Application No. 62/655,643 filed on Apr. 10, 2018; U.S. Provisional Application No. 62/626,247 filed on Feb. 5, 2018; U.S. Provisional Application No. 62/624,493 filed on Jan. 31, 2018; U.S. Provisional Application No. 62/596,492 filed on Dec. 8, 2017; and U.S. Provisional Application No. 62/592,652 filed on Nov. 30, 2017 all disclosures of which are fully incorporated by reference herein for continuity of disclosure.

BACKGROUND OF THE INVENTION

1. Field of the Invention

The invention relates generally to an Internet of Things (IoT) enabled wireless sensor system using attached and/or embedded passive electromagnetic sensors (PES). One embodiment of this invention includes a wireless sensor system, which permits process control and predictive maintenance on a utility's electrical transmission and distribution grid. Another embodiment includes a wireless sensor system, which permits process control and predictive maintenance of liquid or gas through a pipeline. Another embodiment includes a wireless sensor system, which permits measurement of breathable air pollutants.

2. Background

Currently there are many solutions for measuring electrical phenomena such as voltage, amperage, temperature, oscillation, deflection, and humidity on a utility's transmission and distribution Aluminum Conductor Steel Reinforced (ACSR) conductor wire and at substations. Some of these solutions attempt to attach a powered sensor package to an energized ACSR power line carrying 7,500 volts-256,000 volts as part of a discreet sensor project to create a smart grid. These solutions fail to meet the needs of the industry because:

a. Due to the aging out of linemen, Investor Owned Utilities (IOU) and Utility Cooperatives (UC) do not have the manpower or budget to install sensor packages as part of a discrete project on thousands of miles of transmission and distribution ACSR conductor wire;

b. Sensor packages are difficult to install as they weigh approximately 15 pounds and must be lifted on an insulated "hot stick" 30 feet or more in the air and attached to a high voltage power line while the line is energized;

c. Current Sensor packages require a power source. This requires IOU's and UC's to change batteries throughout the lifecycle of the sensor package, or attach a parasitic power source at the time of installation;

d. Current Sensor packages are not sensitive enough to measure very low voltage below 240 volts, creating a safety hazard from ambient voltage from non-grounded power lines;

e. Current Sensor packages have moving parts, which limits their lifespan, resulting in ongoing maintenance;

f. Current Sensor packages are expensive, costing approximately $6,000 per three phase point monitored;

g. Current sensor packages are limited to ACSR conductor wire and substation components, and cannot be placed on power line fuses, transformers, switches, relays, circuit breakers, bus bars, capacitors, clamps, towers and poles, insulators, connectors, couplings, surge arrestors, stirrups, taps, regulation banks or suppressors;

h. Current Sensor packages may not have a central processing unit to execute computations and software programs;

h. Current Sensor packages do not encrypt phenomena data and are subject to hacking;

i. Current Sensor packages do not integrate artificial intelligence to create and improve normal and anomalous algorithms of a grid's health to move a utility from preventive to predictive maintenance.

Other solutions attempt to use passive line sensors, but these solutions are similarly unable to meet the needs of the industry because they require project manpower for installation, only mount to ACSR conductor wire, but not other line transmission and distribution hardware, and are not part of an Internet Of Things (IoT). Still other solutions seek to provide simple inexpensive analogue sensors, but these solutions also fail to meet industry needs because they aren't connected to a communications platform, and simply blink a light to indicate a voltage state.

It would be desirable to have a utility wireless sensor system whose sensors don't require a battery or parasitic power; whose sensors have no moving parts, and so are inexpensive, and last for decades; whose sensors are a component of an existing type of utility transmission and distribution hardware device, so that the sensor doesn't need to be installed as a stand-alone component on high voltage devices after that device is in service; whose sensors don't need to be separately maintained, and are protected from the environment by being encased in a protective pod that is an integral manufactured component of its host and may even be inside the host's packaging. Furthermore, it would also be desirable to have a utility wireless sensor system whose sensor installation could be accomplished during regular maintenance, repair or upgrade of the utility grid components with minimal additional labor costs. Still further, it would be desirable to have a utility transmission and distribution wireless sensor system that provides real time sensor information to create a structural health monitor of the electrical grid, capable of taking action to improve grid health. Still further, it would be desirable to have the system learn a base state and recognize anomalous situations as time went on to create a more accurate structural health monitor of the electrical grid. Therefore, there currently exists a need in the industry for a device and associated method that offers an automated system for tracking the health and structure of a utility's transmission and distribution grid by combining damage detection algorithms with a structural monitoring system, that gains intelligence over time.

Similarly, there are many solutions for measuring the flow of liquid and gas through a pipeline. Some of these solutions use probes that are inserted into the pipeline by drilling or breaching the pipeline. Others use non-powered passive sensors that are clamped to the outside of power lines after the pipeline has been operating. However, these solutions fail to meet the needs of pipeline operators because:

a. Due to the aging out of the workforce, pipeline operators do not have the manpower or budget to install sensor packages as part of a discrete project on thousands of miles of pipeline, often in remote locations;
b. Sensor packages are difficult to install as they weigh approximately 30 pounds and must clamped around a variety of pipes, often feet in diameter;
c. Current Sensor packages require a power source. This requires pipeline operators to have to change batteries throughout the lifecycle of the sensor package, or attach a parasitic power source at the time of installation;
d. Current Sensor packages have moving parts, which limits their lifespan, resulting in ongoing maintenance;
e. Current Sensor packages are expensive, costing approximately $35,000 per node monitored;
f. Current Sensor packages are limited to pipe and cannot be used with valves or pumps;
g. Current Sensor packages may not have a central processing unit to execute computations and software programs;
h. Current Sensor packages may not encrypt data and are subject to hacking;
i. Current Sensor packages do not integrate artificial intelligence to create and improve normal and anomalous databases of a grid's health to move a utility from preventive to predictive maintenance.

It would be desirable to have a wireless sensor system whose sensors don't require batteries or parasitic power; whose sensors have no moving parts, and so are inexpensive, and last for decades; whose sensors are a component of an existing type of pipeline hardware device; whose sensors doesn't need to be separately maintained, and are protected from the environment by being encased in a protective pod that is an integral manufactured component of its host pipeline hardware and may even be inside the host's packaging. Furthermore, it would also be desirable to have a utility wireless sensor system whose sensor installation could be accomplished during regular maintenance, repair or upgrade of the pipeline components with minimal additional labor costs. Still further, it would be desirable to have a pipeline wireless sensor system that provides real time sensor information to create a structural health monitor of the pipeline, capable of taking action to improve pipeline health and safety. Still further, it would be desirable to have the system learn a base state and improve as time went on to create a more accurate structural health monitor of the pipeline. Therefore, there currently exists a need in the industry for a device and associated method that offers an automated system for tracking the health and structure of a pipeline by combining damage detection algorithms with a structural monitoring system, that gains intelligence over time.

Similarly, there are many solutions for measuring air pollutants. Some of these solutions use powered fans to suck large quantities of air into filter systems where pollutant air molecules are separated and measured under controlled conditions. However, these solutions fail to meet the needs of municipalities and homes because:

a. They are composed of large powered fans, motors and complex filter systems that must be manned by technical staff, maintained, and calibrated, resulting in expensive operations;
b. Require utility support such as electricity, lighting, HVAC, plumbing, and waste disposal;
c. Such systems require utility support, they can only be placed in fixed locations;
d. Such systems can only be located in fixed locations, the system is limited in the number of measurement points to tens of locations and not hundreds or thousands of locations;
e. The limited number of measurement points does not allow a municipality to create a breathable air wellness map of an entire municipality, both indoor and outdoor;

Other solutions attempt to use passive sensors where breathable air is captured in containers and sent to a lab for analysis. This type of solution requires a work force to take samples and an accounting system to match samples to locations and times. The samples must be sent to a lab for analysis. Results are not available in real time. This type of pollutant measurement is not part of an Internet of Things (IoT).

It would be desirable to have a breathable air pollution wireless sensor system whose sensors don't require expendable supplies, power, plumbing, or HVAC; whose sensors have no moving parts and so are inexpensive and last for decades; whose sensors are mounted to a component of an existing type of municipality lighting, or electrical transmission grid, or building hardware; whose sensors don't need to be calibrated or serviced. Furthermore, it would also be desirable to have a breathable air pollution wireless sensor system whose sensor installation could be accomplished during regular maintenance, repair or upgrade of the municipalities lighting grid, electrical grid, or building repairs without the additional labor costs of a discrete sensor project. Still further, it would be desirable to have a breathable air pollution wireless sensor system that provides real time pollutant information to create a breathable air health monitor of a municipality, both indoors and outdoors. Still further, it would be desirable to have the system create a base state analysis, recognize anomalous conditions, and learn as time went on to create a more accurate breathable air health monitoring map. This constantly improving system would move the municipality from reactive to preventive action to improve air quality. Therefore, there currently exists a need in the industry for a device and associated method that offers an automated system for tracking the health and wellness of a community's indoor and outdoor air pollutants by combining hundreds or thousands of passive electromagnetic sensors with a real time monitoring system gains intelligence over time.

SUMMARY OF THE INVENTION

Disclosed is a wireless sensor system, which is made up of the following components: at least one or a plurality of uniquely identifiable passive electromagnetic sensor (PES) 3. The PES is an acoustic wave sensor FIG. 1 which may have a microprocessor onboard the sensor chip FIG. 2. At least one or a plurality of Electromagnetic Controller Communicator (ECC) FIG. 8. At least one or a plurality of super computers 65 containing an artificial intelligence means (AI), algorithms, mapping applications, databases, and software applications. At least one or a plurality of networked distributed computational computers 64 used to expand the computational power of the system. At least one or a plurality of distributed user computers 63 that uploads information (weather information, mapping information, databases, algorithms, software applications), and receive sensor information (alarms, machine to machine orders, electrical utility grid wellness maps, pipeline wellness maps, breathable air wellness maps). These components are related as follows: The passive electromagnetic sensor FIG. 3 is embedded as a component in the manufacture of distribution hardware such as ACSR transmission and distribution wire FIG. 10, cutout fuses FIG. 11, transformers FIG. 12, etc. These utility hardware components serve as hosts for the sensors and are physically separated from the Electromagnetic Controller Communicator (ECC) FIG. 8. As the hosts are installed in the utility grid as part of routine maintenance and or upgrade FIG. 13, PES' saturate the utilities electrical transmission and distribution grid FIG. 14. As the PES' come into range of the electromagnetic waves 24 being generated by the transceiver 38 and antenna 36 onboard the ECC, the PES', 32-35, become active. The PES receives these electromagnetic waves causing the sensor to harvest energy and take action, FIG. 9. In one embodiment, the acoustic wave component of the sensor, FIG. 1, harvests the electromagnetic waves by passing the electromagnetic waves through its inbound interdigital transducer 3. The electromagnetic wave is converted into an acoustic wave on the PES' body using the piezoelectric effect 1. The properties of the acoustic wave (amplitude, frequency, phase, and period) are modified by placing films 4, barriers 5, gates 6, gratings 2 & 8, and other test barriers on the acoustic wave chips FIG. 1. The test barriers are designed to modify the acoustic wave's amplitude, frequency phase or period based on the phenomena each sensor is designed to measure. Phenomena include electrical voltage, electrical current, temperature, pressure, humidity, oscillation, deflection, movement, sound vibration, rainfall, air pollutants, chemical agents, biological agents, nuclear agents, etc. If the PES does not have a microprocessor onboard, the PES's outbound interdigital transducers (IDT) 7 transmits the modified wave form back to the antenna 36 and receiver 37 onboard the ECC using backscatter communication 48. The microprocessor onboard the ECC uses software to compute waveform modifications into phenomena measurement values. If the PES does have a microprocessor onboard, FIG. 3, the microprocessor uses modifications in the amplitude, frequency, phase, and period of the acoustic wave to compute the measurement of phenomena. The outbound IDT 7 transmits the phenomena measurement back to the ECC using backscatter communication 48. The ECC maps the phenomena data, FIG. 24, and compares the resulting phenomena information to normal and abnormal models. The ECC can immediately issue alarms and orders for anomalous phenomena conditions to user computers, the supercomputer housing the artificial intelligence, and or distributed computer resources. All ECCs are part of a peer to peer network 66 that includes all user workstations 63, distributed computational resources 64, and supercomputers. This peer to peer network 66 allows the use of blockchain technology means 67 to secure the transmission of phenomena measurement information, alarms and orders, mapping information, and any other information. Programming software causes the communication device onboard the ECC to communicate phenomena measurement information and location information to a supercomputer and users by cellular communication network at periodic intervals. The ECC is powered using photovoltaic panels 46. The super computer assembles the regional ECC maps, including alarms and orders, created by each ECC into a comprehensive electrical grid wellness model, or other representative model depending on the phenomena and data collected, FIG. 24.

The device may also have one or more of the following:
a. PES may use rigid piezoelectric substrates such as crystals, quartz or glass, or flexible piezoelectric substrates such as polymers;
b. PES may not contain a microprocessor;
c. PES may contain one or more relational modules used to compare sensor data;
d. PES may communicate using encryption;
e. PES may communicate using blockchain technology;
f. PES may use alternative electromagnetic or mechanical forms of power such as mechanical vibration, light, radiation, induction, or fuel cell;
g. PES may vary amplitude, frequency phase, period or other wave form characteristic in order create a unique identity for each sensor;
h. PES may measure alternative phenomena to electrical voltage or combinations of phenomena such as electrical current, temperature, pressure, humidity, oscillation, deflection, movement, sound vibration, rainfall, air pollutants, chemical agents, biological agents, nuclear agents, etc.;
i. PES may vary amplitude, frequency phase, or period or other wave form characteristic to encrypt or encode phenomena such as electrical voltage, electrical current, temperature, pressure, humidity, oscillation, deflection, movement, sound vibration, rainfall, air pollutants, chemical agents, biological agents, nuclear agents;
j. PES may be embedded into utility transmission and distribution hardware such as Aluminum Conductor Steel Reinforced (ACSR) transmission and distribution wire, fuses, transformers, switches, relays, circuit breakers, bus bars, capacitors, clamps, towers and poles, insulators, connectors, couplings, surge arrestors, stirrups, taps, regulation banks, suppressors;
k. PES may be externally surface mounted to utility transmission and distribution hardware such as Aluminum Conductor Steel Reinforced (ACSR) transmission and distribution wire, fuses, transformers, switches, relays, circuit breakers, bus bars, capacitors, clamps, towers and poles, insulators, connectors, couplings, surge arrestors, stirrups, taps, regulation banks, suppressors
l. PES may be embedded into oil and gas pipeline hardware such as pipe, valves, and pumps.
m. PES may be externally surface mounted to oil and gas pipeline hardware such as pipe, valves, and pumps.
n. PES may be embedded into municipality lighting and building components such as street lights, street light covers, buildings, walls, windows, etc.
o. PES may be externally surface mounted to municipality lighting and building components such as street lights, street light covers, buildings, walls, windows, etc.
p. PES may communicate between each other and or act as a relay for a more distant PES;
q. ECC's may be powered using solar panels, parasitic load from the utility grid, batteries, or a fuel cell;
r. ECC's may compute variations in amplitude, frequency phase, or period or other wave form characteristic received from the PES to compute the measurement of a phenomena such as electrical voltage or combinations of phenomena such as electrical current, temperature, pressure, humidity, oscillation, deflection, movement, sound vibration, rainfall, air pollutants, chemical agents, biological agents, nuclear agents, etc.:

s. ECC's may communicate to the internet through Cellular networks, LoRa networks, satellite networks, or microwave networks;
t. ECC's communicate in an encrypted format;
u. ECC's may secure communications using blockchain technology;
v. ECC's may contain one or more relational modules used to compare sensor data;
w. Supercomputer may have human interface at any component of its processes;
x. Supercomputer may secure communications using blockchain technology;

Similarly, the associated method may also include one or more of the following steps:

a. The processor onboard the PES may contain an algorithm engine and programming logic comprised of: (i) a database containing at least one normal voltage, or other phenomena, measure and/or; (ii) a second relational module for comparing the real-time voltage, or other phenomena, pattern against at least one anomalous pattern, associated with an alarm communication and/or; (iii) a third relational module for comparing the real-time voltage, or other phenomena, pattern against at least one or more hardware failure patterns.
b. The processor onboard the Electromagnetic Controller Communicator (ECC) may contain an algorithm engine and programming logic comprised of: (i) a database containing at least one normal voltage, or other phenomena, measure and/or; (ii) a second relational module for comparing the real-time voltage, or other phenomena, pattern against at least one anomalous pattern, associated with an alarm communication and/or; (iii) a third relational module for comparing the real-time voltage, or other phenomena, pattern against at least one or more hardware failure patterns; (iv) a mapping module for mapping sensor voltage, or other phenomena, from multiple sensor data streams into a real-time wellness pattern.
c. The processor and programming logic onboard the ECC may also use the real-time sensor information to create a structural utility grid monitor by combining damage detection algorithms with a structural monitoring system.
d. The programming logic stored on the data storage device onboard the ECC may cause the system to issue an execution command, which could be encrypted, to another peer to peer device upon recognizing anomalous pattern matches and matching an action sequence prescribed by an algorithm or programming logic. Such commands can cause terminating, diverting, adding or subtracting voltage from various grid segments and components to improve the health of the utility grid. These actions can also be made to occur for other phenomena such as electrical current, temperature, pressure, humidity, oscillation, deflection, movement, sound vibration, rainfall, air pollutants, chemical agents, biological agents, nuclear agents.
e. The wireless sensor system may act as a peer to peer network (P2P) where the programming logic stored with the computer processor onboard the sensor or ECC may cause the system to create a block in a blockchain transaction for alarm, order, map, or transmission of all measured phenomena. In this instance, a unique ECC requests a transaction as a member of the peer to peer network (P2P) 66. The network, consisting of multiple ECC's 47, supercomputer(s) 65, user terminals 63 and distributed computational resources 64, verifies the requesting sensors identity and status using algorithms. Once verified, the ECC can issue a phenomena alarm, can issue a hardware failure alarm, can create and transmit a real-time wellness maps, can create and transmit real-time patterns, can issue execution commands to other machines as blocks in a blockchain 68. The programming logic stored on the data storage device onboard the ECC may cause the system to communicate the blockchain transaction to the peer to peer network (P2P) FIG. 23. This method allows for both local and distributed security and verification of structural health monitor maps, reports, alarms, and orders to the utility electrical grid;
g. The wireless sensor system may send its data and information to a supercomputer 65 housing artificial intelligence means. The artificial intelligence uses this data and information to learn, demonstrate, explain, and advise users in the creation of more accurate phenomena patterns for each ECC's environment for both normal and anomalous conditions. The artificial intelligence causes new algorithms and relational modules to be transmitted and uploaded to individual ECC, resulting in wellness models becoming more accurate and predictive. Over time, the wellness model becomes accurate enough to transition the utility from preventive to predictive maintenance for the grid;
h. In the alternative, this wireless sensor system may be used by pipelines carrying oil and gas, water, ammonia, alcohol, hydrogen, steam, or any other gas or liquid. The wireless multi sensor network that comprises a plurality of PES's, may be attached to, or embedded as a manufactured internal component of distribution hardware used in pipelines such as pipe, valves, pumps, etc. In addition to the phenomena listed above, these sensors could be made to measure concentration, composition, and flow rate, etc.
i. In the alternative, this wireless sensor system may be used by municipalities to measure indoor and outdoor breathable air pollutants. The wireless multi sensor network that comprises a plurality of PES's, may be attached to, or embedded as a manufactured internal component of distribution hardware used in a municipalities lighting or electric grid, or building hardware such as walls and or glass, etc. In addition to the phenomena listed above, these sensors could be made to measure composition, concentration, and saturation rates of rainfall, air pollutants, chemical agents, biological agents, nuclear agents etc.

The disclosed device is unique when compared with other known devices and solutions because it: (1) uses inexpensive passive sensors FIG. 3 that do not require a battery or parasitic power source; and (2) may have a microprocessor onboard the PES FIG. 2; and (3) uses a protective pod structure where the glass pod is inert to electrical and magnetic phenomena, impervious to UV radiation, impervious to moisture, dispels heat, and has a high surface crush resistance. This makes the PES capable of being attached to or embedded as a component of any IOU, CU, or municipality power transmission and distribution hardware FIG. 13, lighting grid hardware FIG. 20 or, structural architectural components such as buildings, windows, doors, walls, etc. which serve as hosts for the sensors FIGS. 14, 18, 20 and 21; and (4) may be installed with its host as a normal part of construction, maintenance, or upgrade. Similarly, the associated method is unique in that it: (1) creates a peer to peer (P2P) wireless sensor network 66; (2) is a smart grid in that the system takes action (alarms and orders) after comparing measured phenomena to normal and anomalous relational module patterns; and (3) creates a real-time electrical grid, pipeline, or breathable air wellness map FIG. 24 by combining the information of hundreds or thousands or tens of thousands of PES' into a single depiction. Similarly, the disclosed method is unique when compared with other known processes and solutions in that it: (1) secures phenomena measurement, alarms, orders, and wellness information as blocks in a blockchain 68, making the data and information trustworthy; (2) allows the expansion of real time monitoring from static locations with utility services to any location; (3) because the passive sensors have no moving parts, they can last for decades and (4) through the use of improved relational module and artificial intelligence, the system moves the user from reactive to preventive grid, pipeline, or air quality management.

Furthermore, the process associated with the aforementioned device is likewise unique. More specifically, the disclosed process owes its uniqueness to the fact that it: (1) takes action such as communicating alarms and issuing commands based on programmed logic that compares the current state to known patterns of normal and anomalous situations; (2) creates mapped wellness models depicting thousands of sensors in every component of the utility grid, pipeline, or city FIG. 24; and (3) uses artificial intelligence to create improved algorithms and databases that are transmitted and uploaded to the ECC 47, resulting in wellness models becoming more accurate and predictive.

Among other things, it is an objective of the present invention to provide a wireless sensor system enabling process control and predictive maintenance on a utility transmission and distribution grid, gas or liquid pipeline, and real-time breathable air wellness monitoring for municipalities that does not suffer from any of the problems or deficiencies associated with previous solutions.

It is still further an object of the present invention to create a wireless sensor system enabling process control and predictive maintenance on a utility transmission and distribution grid, gas or liquid pipeline, and real-time breathable air wellness monitoring for municipalities that can be installed during routine maintenance and upgrade of electrical grid components, pipeline components, or municipal assets such as lighting grids and building components.

Further still, it is an object of the present invention to create a wireless sensor system enabling process control and predictive maintenance on a utility transmission and distribution grid that is safer by not requiring linemen to attach a sensor package to a live conductor power line 30 feet to 150 feet in the air.

Further still, it is an object of the present invention to create a wireless sensor system enabling process control and predictive maintenance on a utility transmission and distribution grid that is safer for linemen by being able to read voltages below 240 volts common in ambient voltage situations created by improperly grounded power lines.

Further still, it is an object of the present invention to create a wireless sensor system enabling process control and predictive maintenance on a utility transmission and distribution grid that is more robust by having sensors in substantially all grid hardware such as conductor wire, cut-out fuses, transformers, switches, relays, circuit breakers, bus bars, capacitors, clamps, towers and poles, insulators, connectors, couplings, surge arrestors, stirrups, taps, regulation banks, suppressors.

Further still, it is an object of the present invention to create a wireless sensor system enabling real-time breathable air wellness monitoring for municipalities that is more robust by having sensors in substantially all municipality locations.

Further still, it is an object of the present invention to create a wireless sensor system enabling process control and predictive maintenance on a utility's electrical transmission and distribution grid, company's liquid and gas pipeline, and a municipality's breathable air wellness monitoring system whose sensors do not require batteries and ongoing maintenance.

Further still, it is an object of the present invention to create a wireless sensor system enabling process control and predictive maintenance on a utility's electrical transmission and distribution grid, company's liquid and gas pipeline, and municipalities breathable air wellness system whose sensors have no moving parts and so can last for decades.

Further still, it is still an object of the present invention to create a wireless sensor system enabling process control and predictive maintenance on a utility's electrical transmission and distribution grid, a company's liquid and gas pipeline and municipalities breathable air wellness system whose sensors have no moving parts and are inexpensive.

Further still, it is still an object of the present invention to create a wireless sensor system enabling process control and predictive maintenance on a utility's electrical transmission and distribution grid, company's gas and liquid pipeline, and municipality's breathable air wellness system whose sensors data is secure from hacking.

Further still, it is still an object of the present invention to create a wireless sensor system enabling process control and predictive maintenance on a utility's electrical transmission and distribution grid, company's liquid and gas pipeline and municipality's breathable air wellness system whose sensors data and models are verifiable and trustworthy as part of a block chain.

Further still, it is still an object of the present invention to create a wireless sensor system enabling process control and predictive maintenance on a utility's electrical transmission and distribution grid, company's liquid and gas pipeline, municipalities breathable air wellness system whose system use artificial intelligence to create and improve algorithms and databases that are transmitted and uploaded to individual Electromagnetic Controller Communicators (ECC), resulting in wellness models becoming more accurate and predictive.

The invention will now be described more fully hereinafter with reference to the accompanying drawings, which are intended to be read in conjunction with both this summary, the detailed description and any preferred and/or particular embodiments and variations specifically discussed or otherwise disclosed. This invention may, however, be embodied in many different forms and should not be construed as limited to the embodiments set forth herein; rather, these embodiments are provided by way of illustration only and so that this disclosure will be thorough, complete and fully conveys the full scope of the invention to those skilled in the art.

DETAILED DESCRIPTION OF THE INVENTION

The present invention is directed to an Internet of Things (IoT) enabled wireless sensor system permitting process control and predictive maintenance on a utility's electrical transmission and distribution grid and/or an Internet of Things (IoT) enabled wireless sensor system permitting process control and predictive maintenance on a company's liquid and gas pipeline and/or an Internet of Things (IoT) enabled wireless sensor system permitting measurement of indoor and outdoor air pollutants using embedded or attached Passive Electromagnetic Sensors (PES).

Figure 1:
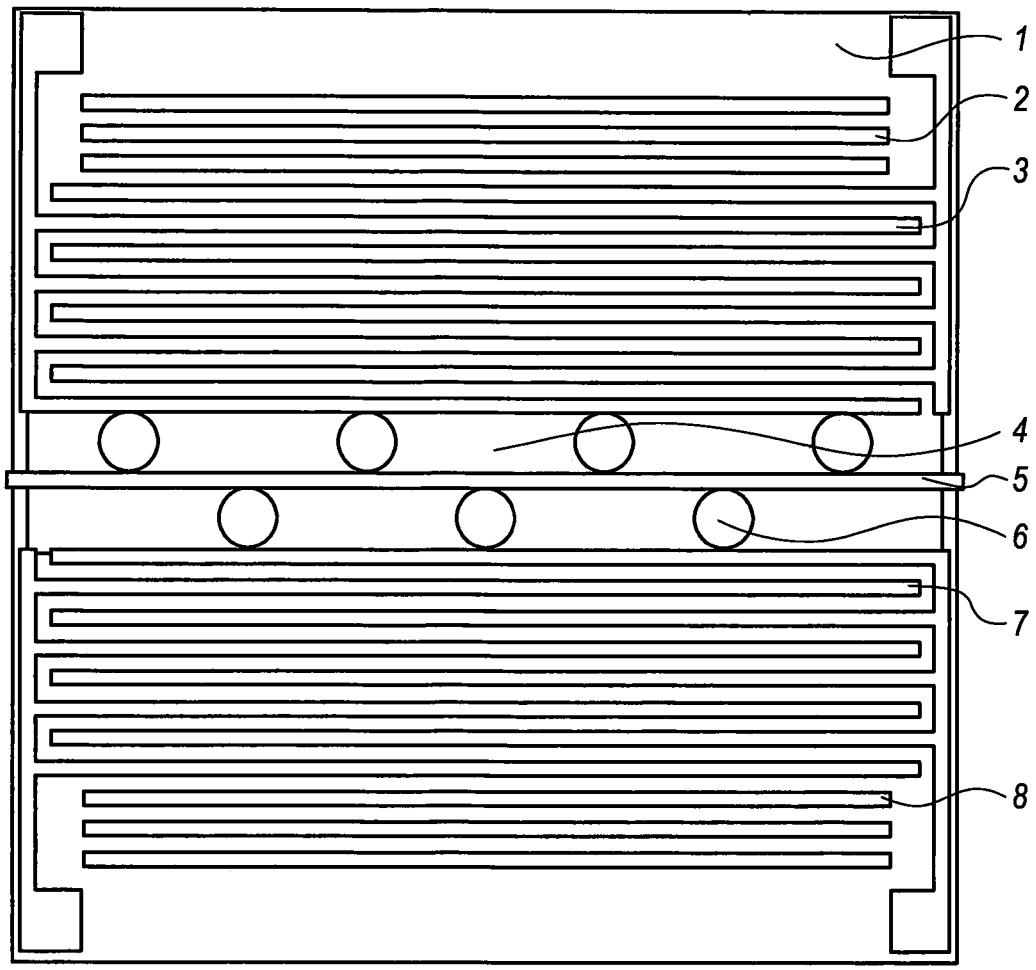
FIG. 1.—A passive acoustic wave (AW) sensor made of a flexible piezoelectric polymer substrate allowing for the modification of an acoustic wave whose modification allows for the measurement of a phenomena such as electrical voltage, electrical current, temperature, etc.
Figure 2:
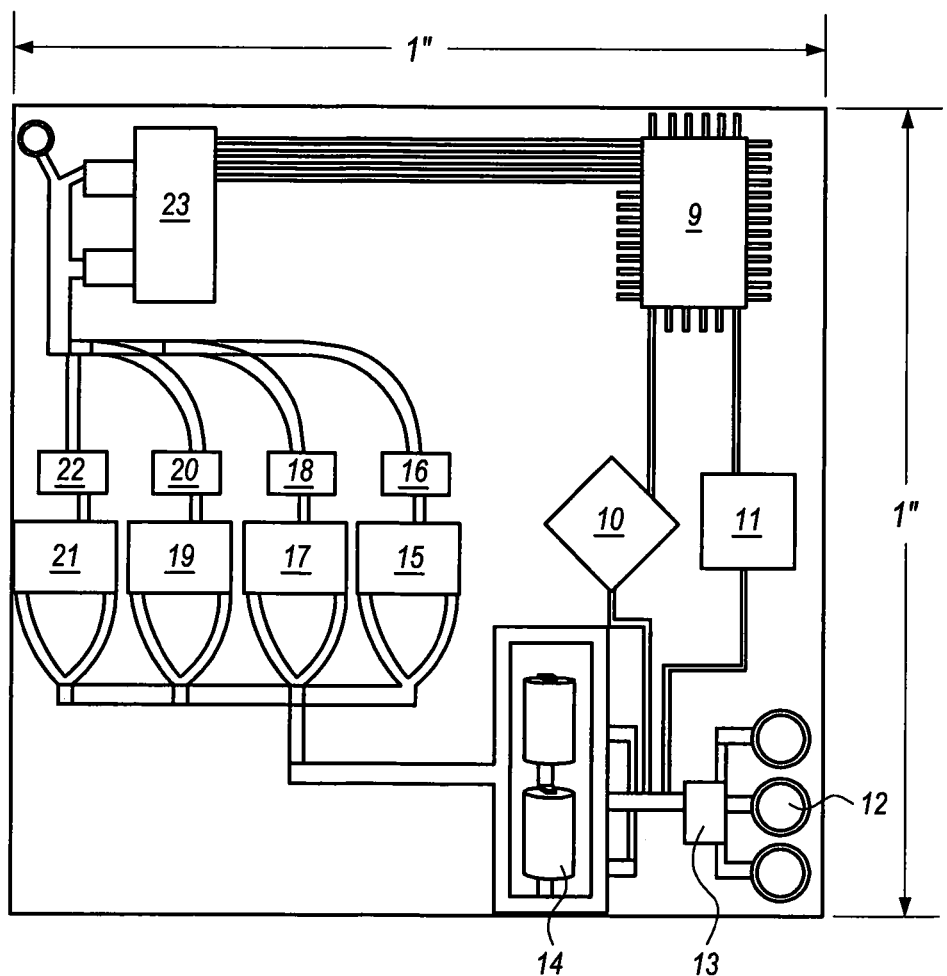
FIG. 2.—A passive microprocessor made of a flexible piezoelectric polymer capable of computational analysis.
Figure 3:
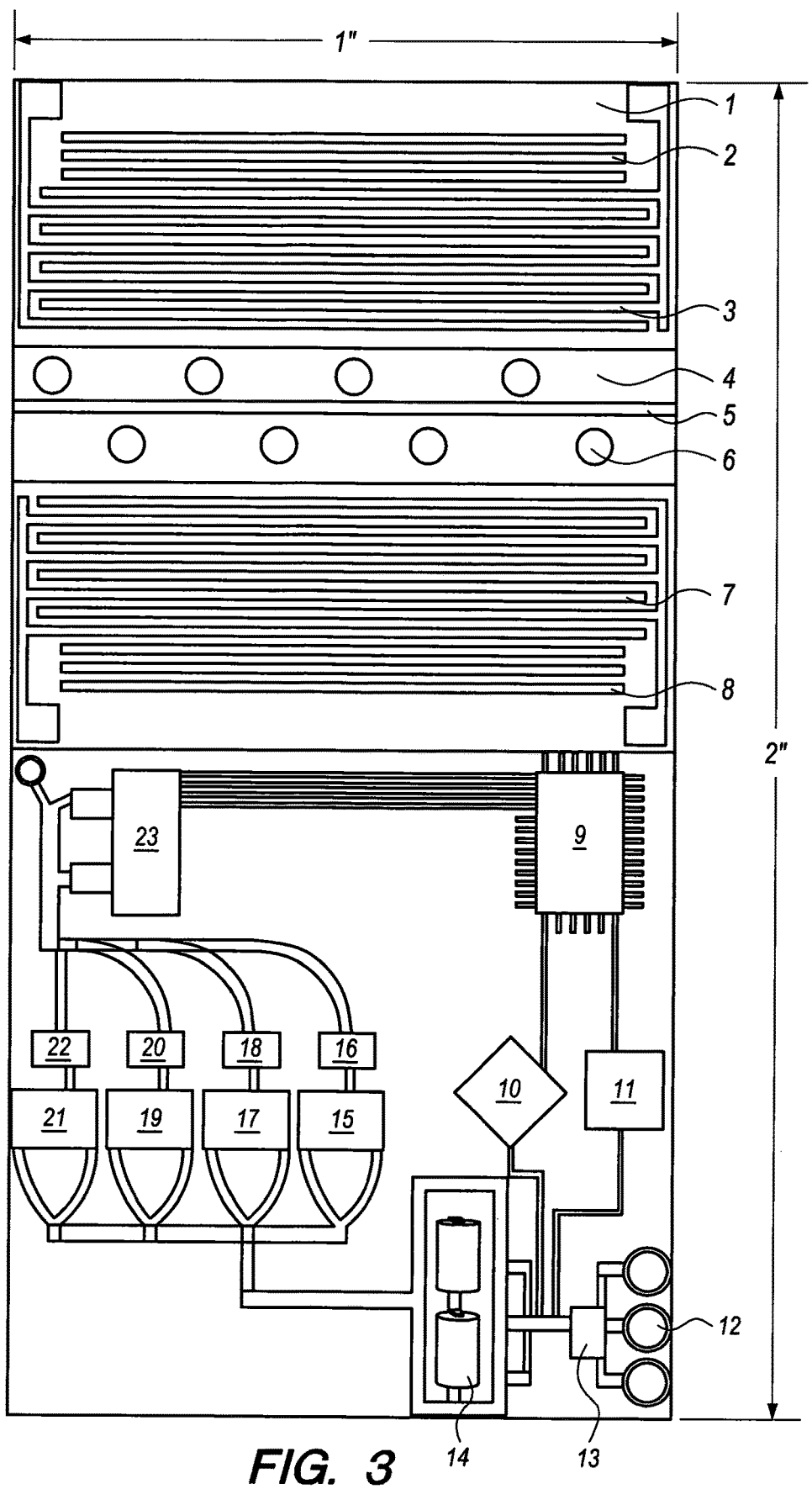
FIG. 3.—Passive Electromagnetic Sensor (PES) capable of measuring the modification of an acoustic wave and calculating a phenomena value from that modification resulting in a measurement of electrical voltage, electrical current, temperature, etc.
Figure 4:
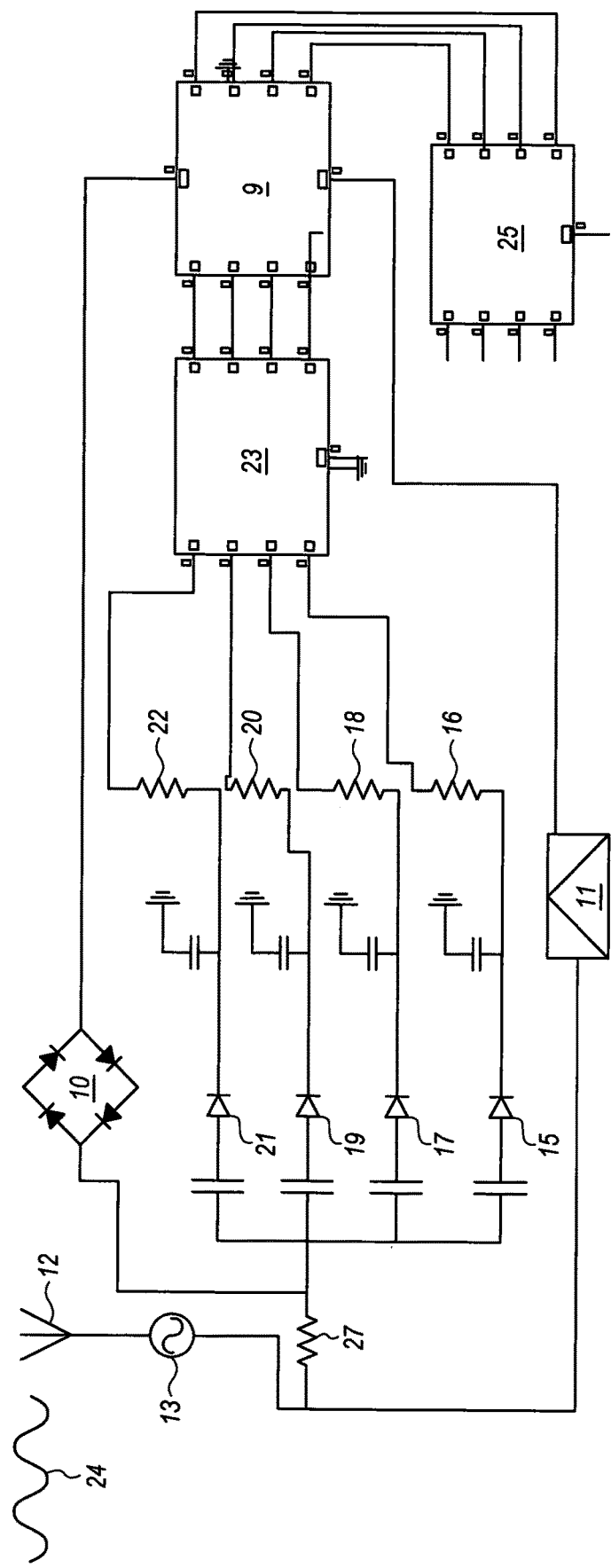
FIG. 4.—Electrical diagram of a PES that includes a passive acoustic wave sensor and a passive microprocessor component.
Figure 5:
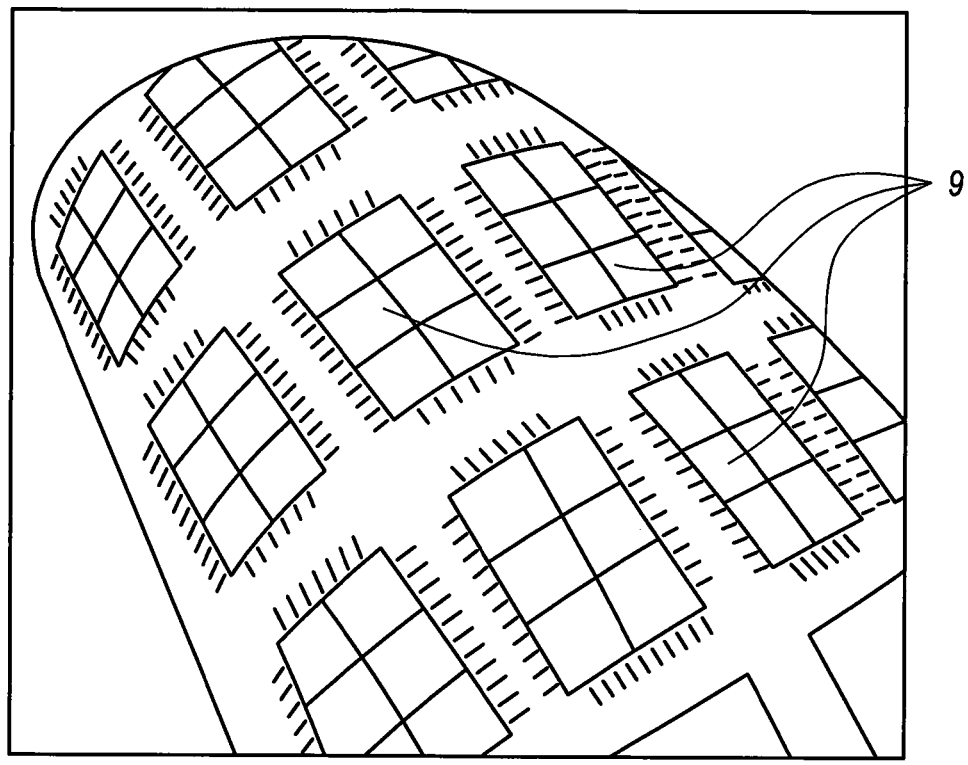
FIG. 5.—Passive CPU printed on a flexible piezoelectric polymer substrate.
Figure 6:
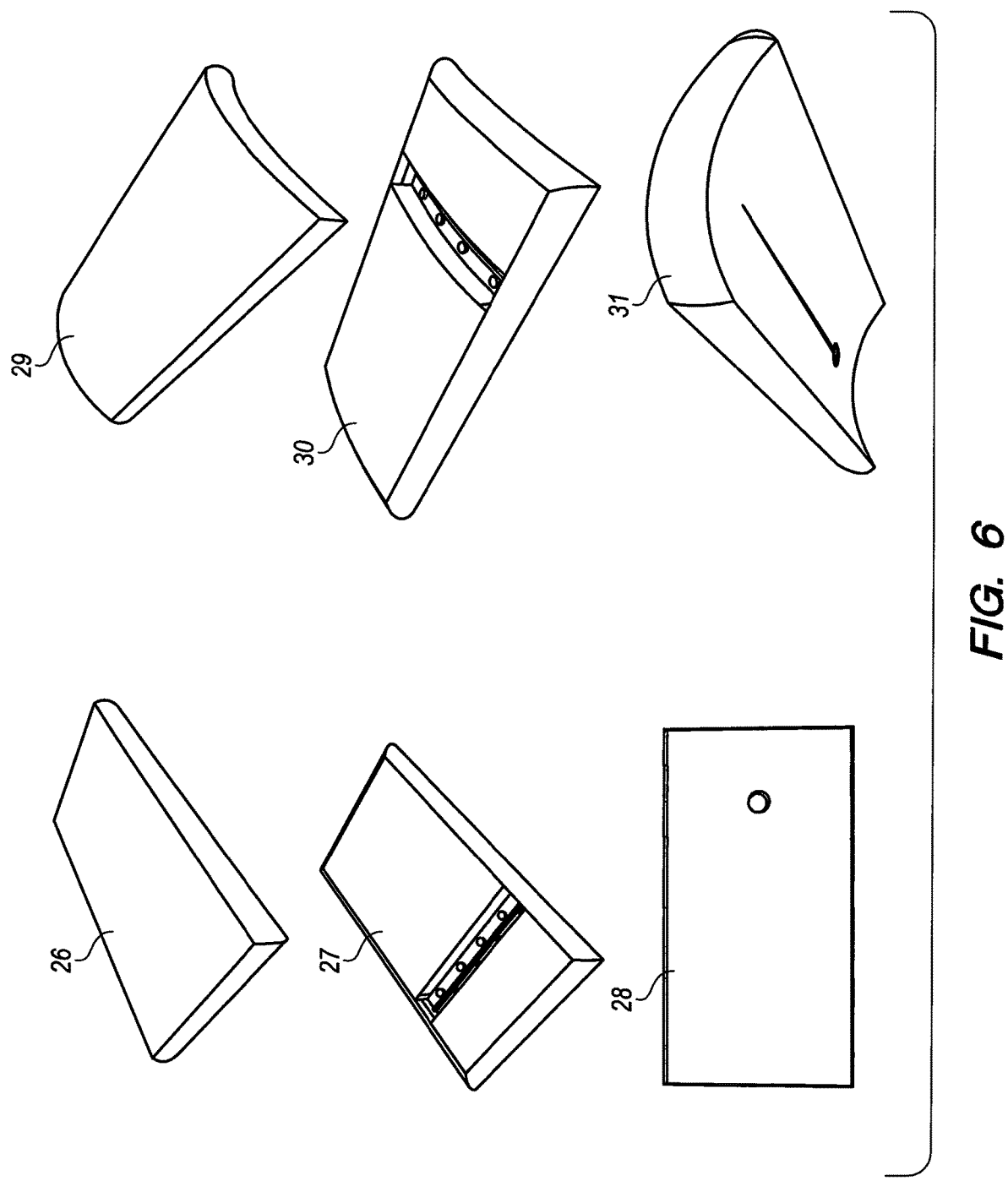
FIG. 6.—Protective glass pod that is inert to electricity, electromagnetic waves, solar radiation, and dissipates heat, and has a high abrasion and crush factor. These pods can have the gap line closed or open to allow exposure to the environment and can be flat or curved.
Figure 7:
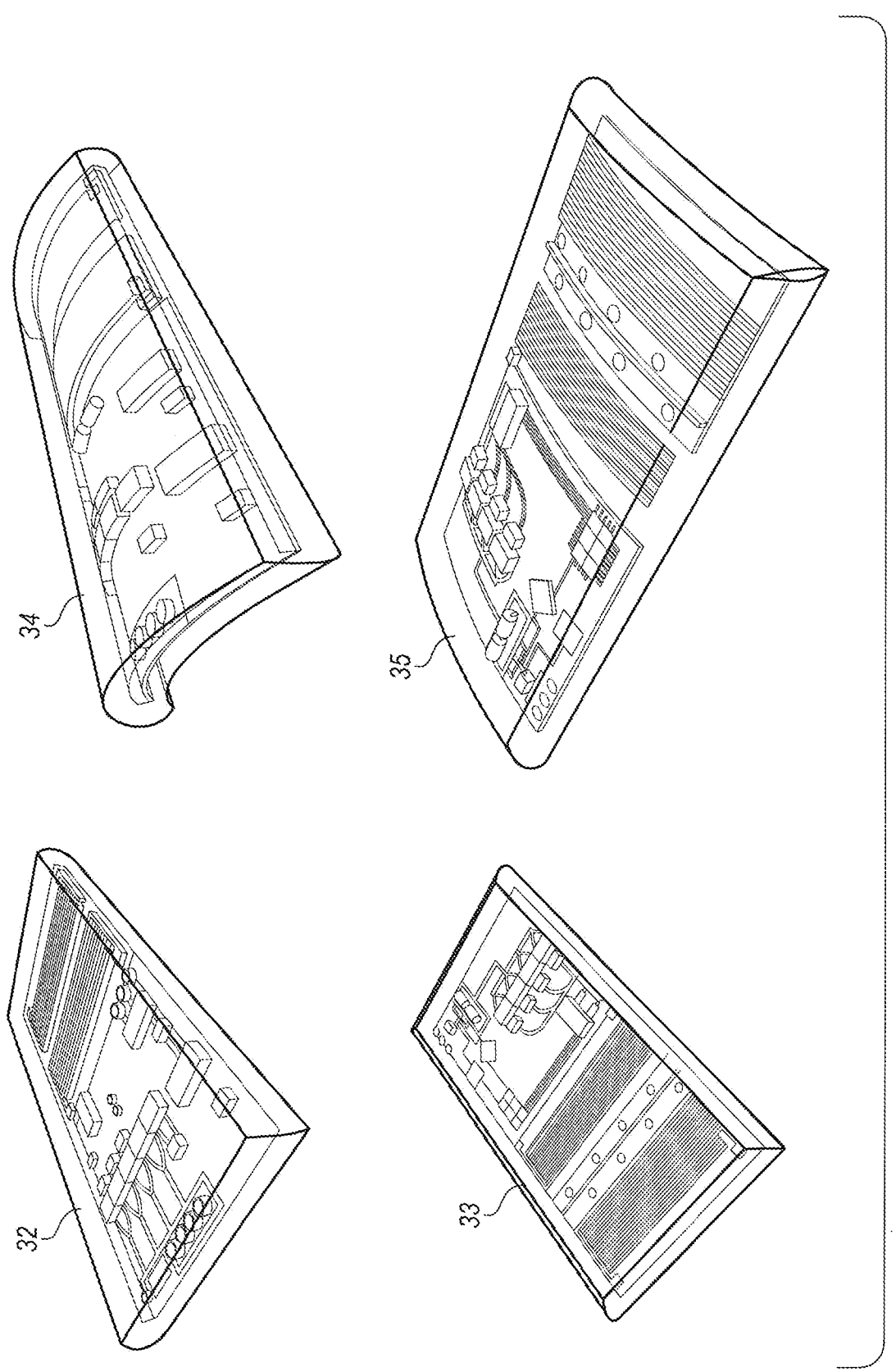
FIG. 7.—PES encased in a glass pod. The encased PES allows the PES to be added as a manufactured component of distribution hardware such as a utility's electrical grid hardware, a company's pipeline hardware, or a municipality's lighting and building hardware.
Figure 8:
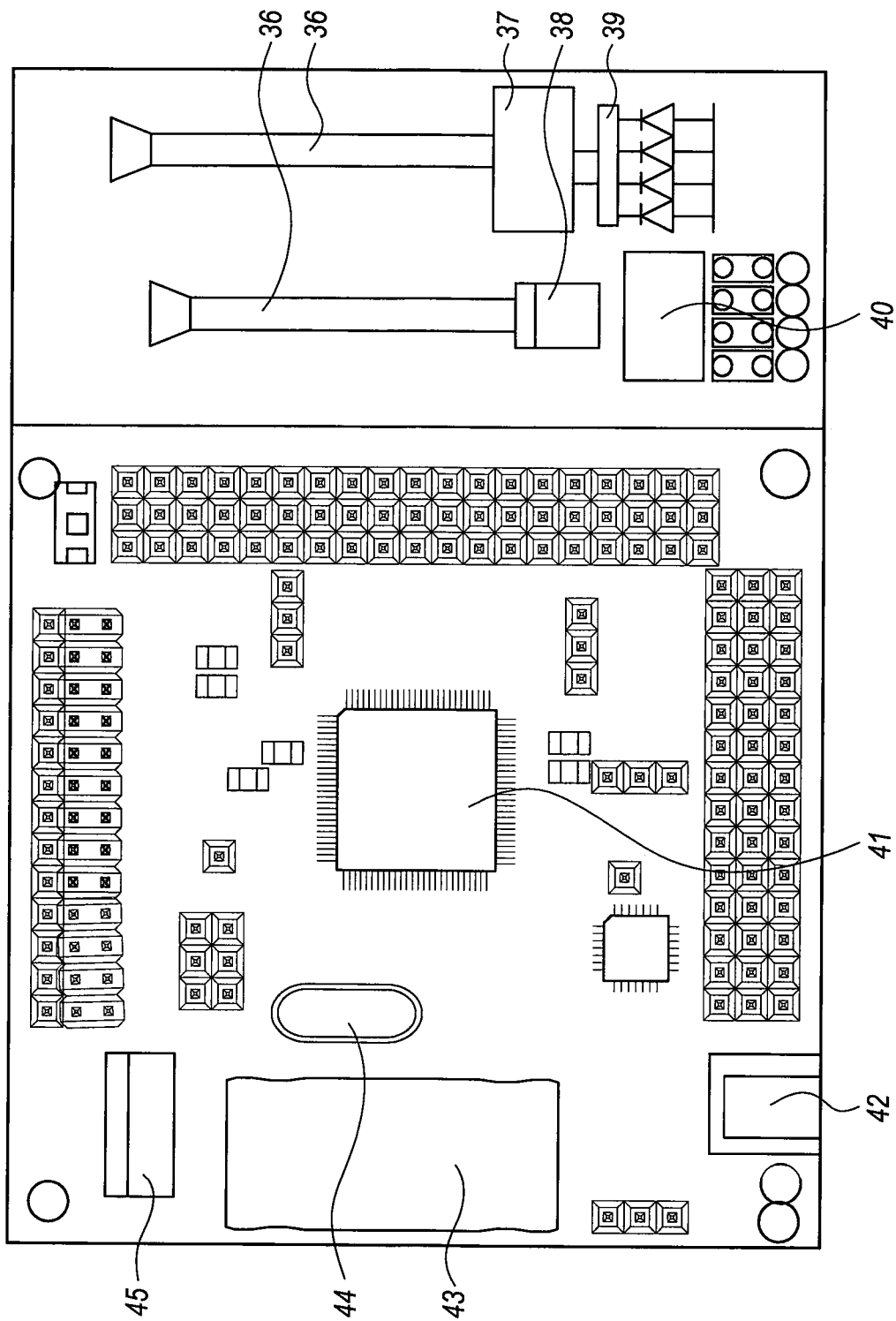
FIG. 8.—Electromagnetic Controller Communicator (ECC) is a small computer powered by solar energy. The ECC may compute phenomena, and processes measurements it receives from many sensors. The ECC maps the phenomena data, which creates a wellness map. The ECC compares the resulting multidimensional phenomena information to normal and abnormal relational models. Matches to abnormal relational models result in alarms and or commands issued to other machines to restore the wellness of the utility grid in transformers.

In one embodiment, the wireless sensor system is made up of the following components: one or multiple passive electromagnetic sensor (PES) FIG. 3, composed of a passive acoustic wave sensor FIG. 1 and a passive microprocessor FIG. 2, enclosed in a specialty glass pod, FIG. 6, one or multiple Electromagnetic Controller Communicators (ECC) FIG. 8, one or user computers 63, one or multiple supercomputers 65 housing artificial intelligence means, databases, algorithms, one or multiple distributed computing resources 64.

Figure 15:
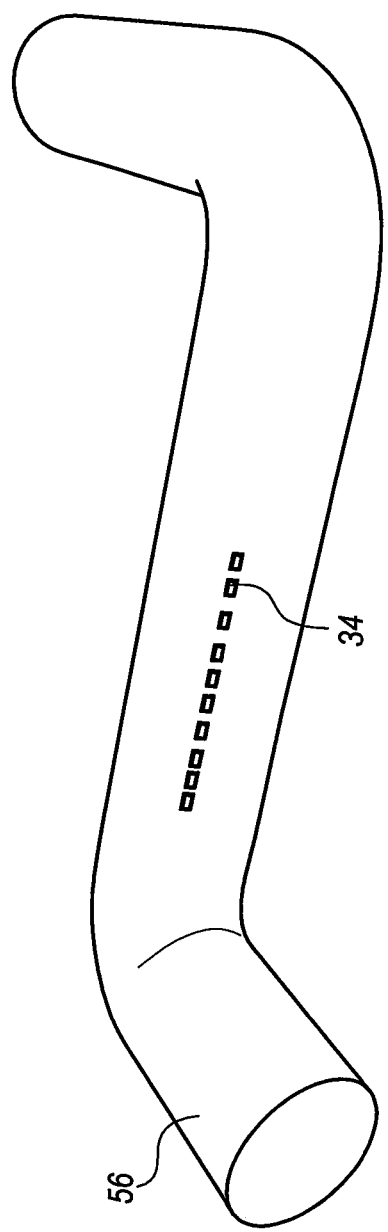
FIG. 15.—Oil pipeline pipe. There are PESs attached to the outer skin of the pipeline. The PESs can be sealed or have the acoustic wave components gap line open to the environment.
Figure 16:
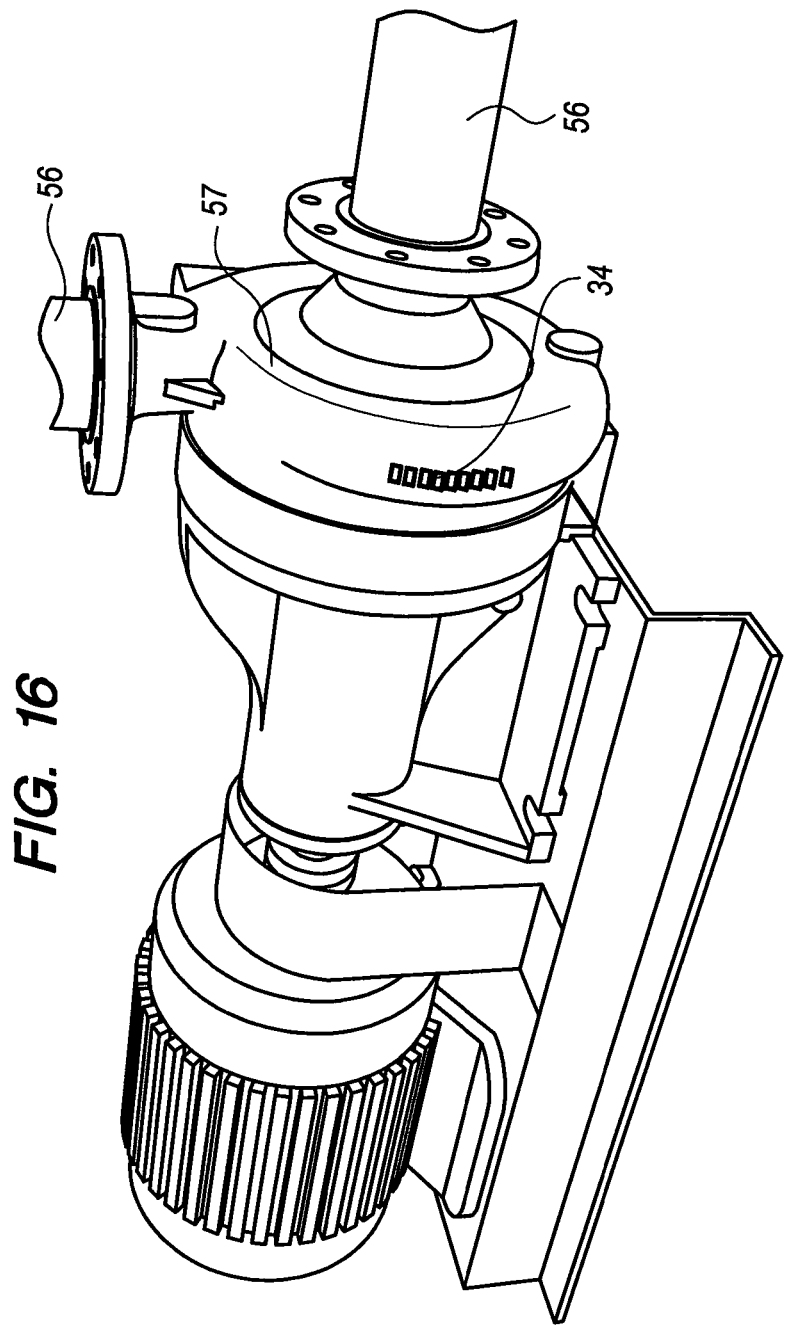
FIG. 16.—Oil pipeline pump. There are PESs attached to the outer skin of the impeller. The PESs can be sealed or have the acoustic wave components gap line open to the environment.
Figure 17:
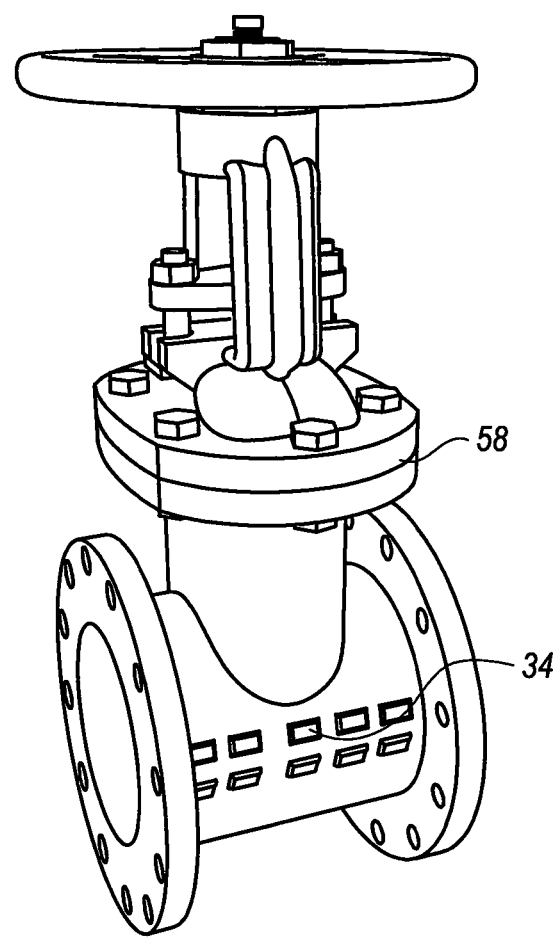
FIG. 17.—Oil pipeline valve. There are PESs attached to the outer skin of the pipeline. The PESs can be sealed or have the acoustic wave components gap line open to the environment.
Figure 19:
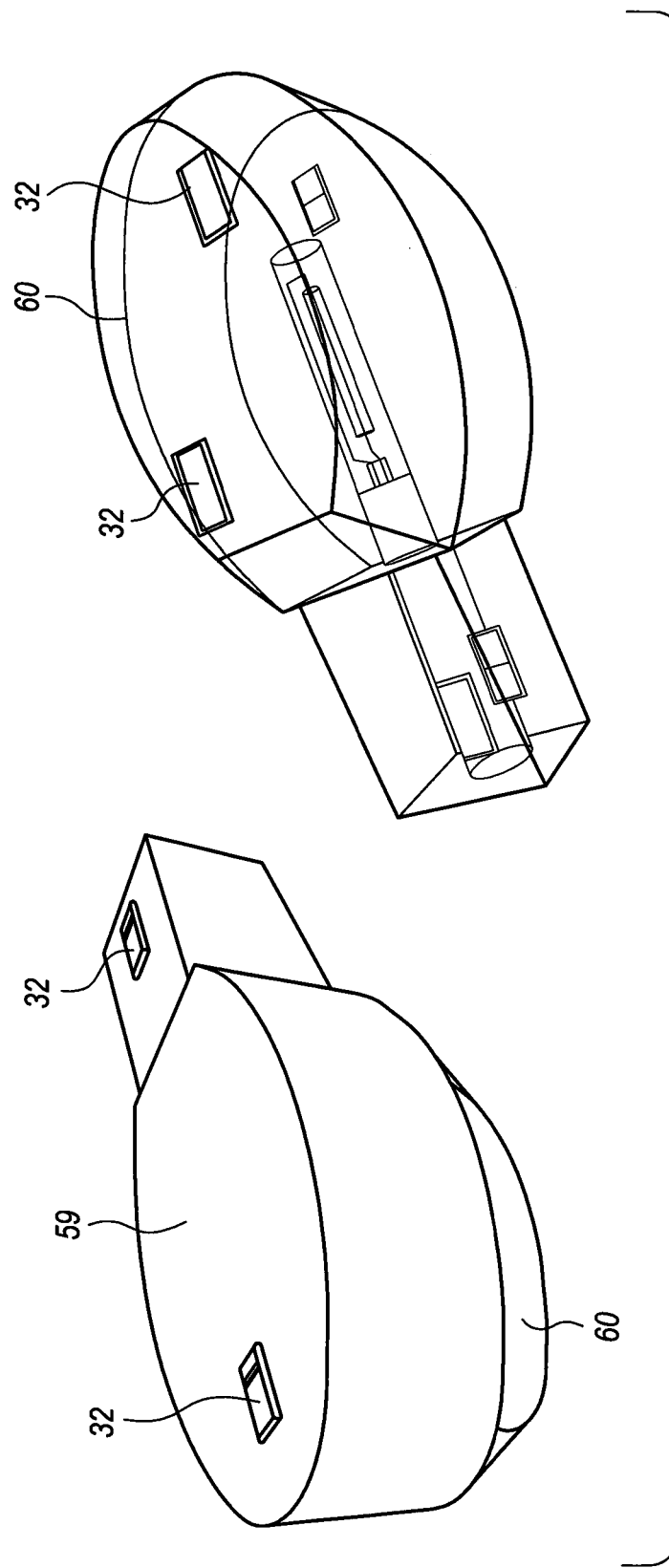
FIG. 19.—Municipality's lighting grid street light. The PES are embedded to the top surface of the light fixture. The PESs are also embedded in the glass or plastic cover of the light fixture.
Figure 23:
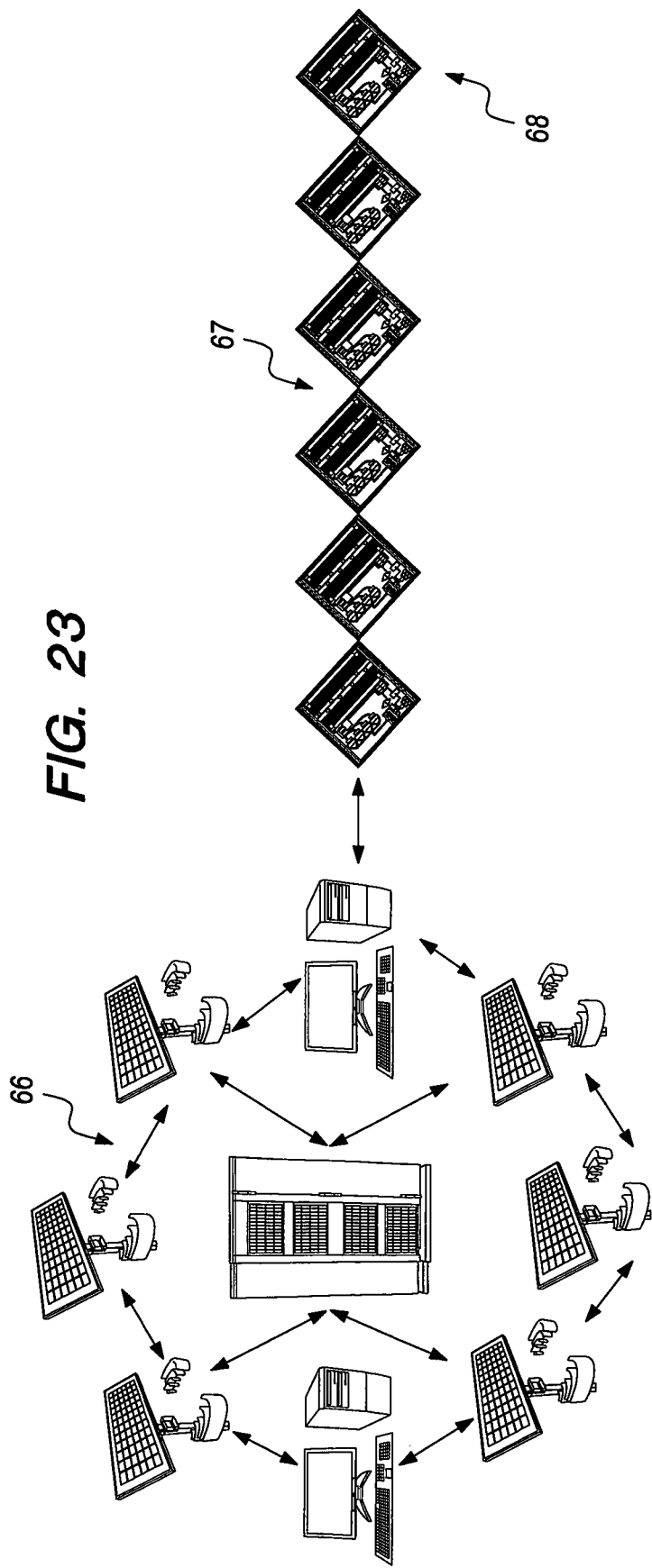
FIG. 23.—In the peer to peer network of the invention, the ECC is positively identified by the other network devices and allowed to add its phenomena measurements, alarms, orders, maps, and information as a block in a blockchain, making these items trustworthy.

The PES is a miniature passive computer sensor FIG. 3, being comprised of a rigid or flexible piezoelectric polymer based passive acoustic wave sensor. FIG. 1, combined with a passive microprocessor, FIG. 2. The acoustic wave (AW) sensor, FIG. 1, being comprised of a flexible piezoelectric polymer substrate 1, one or more interdigital transducers (IDT) 3 & 7, a delay gap having films 4, barriers 5, gates 6, gratings 2 & 8, and other test barriers on the AW sensor FIG. 1. The inbound IDT 3 on the AW sensor FIG. 1 harvests electromagnetic waves 24 and converts the electromagnetic waves into an acoustic wave propagated over the piezoelectric substrate 1. The acoustic wave's amplitude, frequency, phase and or period is modified as the acoustic wave passes over delay gap tests such as films 4, barriers 5, gates 6, gratings designed to interact with the environment and modify the acoustic wave based on the phenomena being measured. The measurement of the modification of the acoustic wave is used to compute the measurement value of phenomena such as electrical voltage, electrical current, temperature, pressure, humidity, oscillation, deflection, molecule flow rates, rainfall, air pollutants, chemical agents, biological agents, nuclear agents, chemical concentration, chemical composition, and particulate matter. The microprocessor FIG. 2 is composed of an antenna 12, a demodulator 10, one or more electromagnetic power harvester(s) 15-22, a voltage controller FIG. 23, a central processing unit (CPU) 9, a modulator 11. The microprocessor component of the PES becomes active when it receives electromagnetic waves from the antenna 36 and transceiver 38 on the ECC. The Antenna 12 harvests these electromagnetic waves and converts the wave to alternating current 13. The alternating current is converted to direct current through the use of diodes, 15, 17, 19, 21. The DC current is then stored in capacitors 16,18,20,22. The voltage regulator 23 regulates the energy in the capacitors 16,18,20,22 to an acceptable level for use by the CPU 9. The voltage regulator 23 releases energy to the CPU once an acceptable level is reached in the capacitors 16,18,20,22. The CPU 9 is powered to execute its computational function, such as computing the phenomena value from a modified acoustic wave designed to measure voltage. The CPU's onboard logic means causes transistor (s) in the antenna 12 to switch, changing the reflection coefficient of the antenna 12. The modulator 11 varies the properties of a Radio-Frequency waveform being received from the ECC 47, called the carrier signal, with a modulating signal that contains the computed phenomena measurement, which is then transmitted back to the ECC 48. The use of the transistors in the antenna 12 and modulator 11 allows the PES to reflect back the ECC's radio waves 48 containing data and information. This transmission method, called backscatter communication, allows the PES FIG. 3 to use much less power than trying to create a new radio wave to send data back to the ECC 47. The PESs also communicate between each other by acting as a relay for a more distant PESs 48. PESs FIG. 3 are manufactured in such a way as to allow these sensors a unique identification, a unique frequency, and a unique host hardware category type identification (ACSR conductor wire, fuse, transformer, pipe, valve, light cover, wall, window, etc.). The segregation of PESs into categories allows the ECC to emit specific electromagnetic waves that are answered by only that category. For example, PESs measuring electrical voltage may have an antenna that only receives radio waves of 13.56 MHz. When the ECC emits electromagnetic waves in 13.56 MHz, only voltage PESs respond. This segregation lessens the ECC's workload by reducing data and information coming to an ECC in an environment saturated with thousands of PESs. Each PES FIG. 3 is encased in a specialty glass pod. The pods can be flat 32 or have a curved bottom 34 for attachment to a host device like ACSR conductor wire 34. Once the PES is contained in the glass pod, the PES can be attached onto or embedded into distribution hardware such as utility distribution hardware FIGS. 10-12, attached or embedded into a company's liquid and gas pipeline hardware FIGS. 15-17, and attached or embedded into a municipalities lighting and building environment hardware, FIGS. 19 & 21.

The Electromagnetic Controller Communicator (ECC) FIG. 8 is comprised of an electromagnetic Radio-Frequency (RF) antenna 36, an encoder 40, Radio-Frequency (RF) transceiver 38, capable of frequency modulation, a Radio-Frequency (RF) receiver 37, a decoder 39, a CPU 41, data storage device 42, a battery 43, global positioning system device 44, cellular communications device 45, algorithm, and programming logic means. The ECC both sends 24 and receives 48 electromagnetic waves. The ECC can have its algorithms and programming logic updated over its cellular interface 45. These algorithm and programming logic upgrades, created by the artificial intelligence located in the super computer 65, will continue to become more accurate over time. Each ECC has its own unique identity and can communicate its GPS location.

One or more user computers 63 are capable of processing inquiries, inputting maintenance records of equipment faults, inputting reduction of capacity, and other anomalous conditions. The user computer can also receive sensor information, alarms, system orders, and utility grid wellness maps.

One or more distributed computing resources 64 are capable of processing quantities of computations and sophisticated data analytics and calculations.

One or more supercomputers 65 are comprised of artificial intelligence (AI) means with upload feeds of data and information from each ECC. The AI is capable of exhibiting intelligent behavior, such as learning, demonstrating, explaining, creating correlations and advising its users. The AI is capable of creating correlations between sensor data and equipment faults, sensor data and reduction of capacity, sensor data and other anomalous conditions local and inter-area oscillations. The AI uses these newly found correlations to create algorithms of anomalous conditions and sends these algorithm updates to each ECC.

These components are connected as follows: A wireless sensor system comprised of hundreds or thousands of uniquely identifiable PES 32-35, communicating using electromagnetic waves 24 & 48, with an ECC 47. The system has hundreds of ECCs being placed at every mile of a utility's electrical transmission and distribution grid FIG. 14, a company's liquid and gas pipeline FIG. 18, and municipalities lighting FIG. 20, and building environment FIG. 21. Installation of PES's and ECC's occurs as host components are installed as part of routine maintenance and system upgrades of distribution hardware. Each ECC is connected to one or more super computers 65, housing artificial intelligence, through the Internet FIG. 12.

Figure 9:
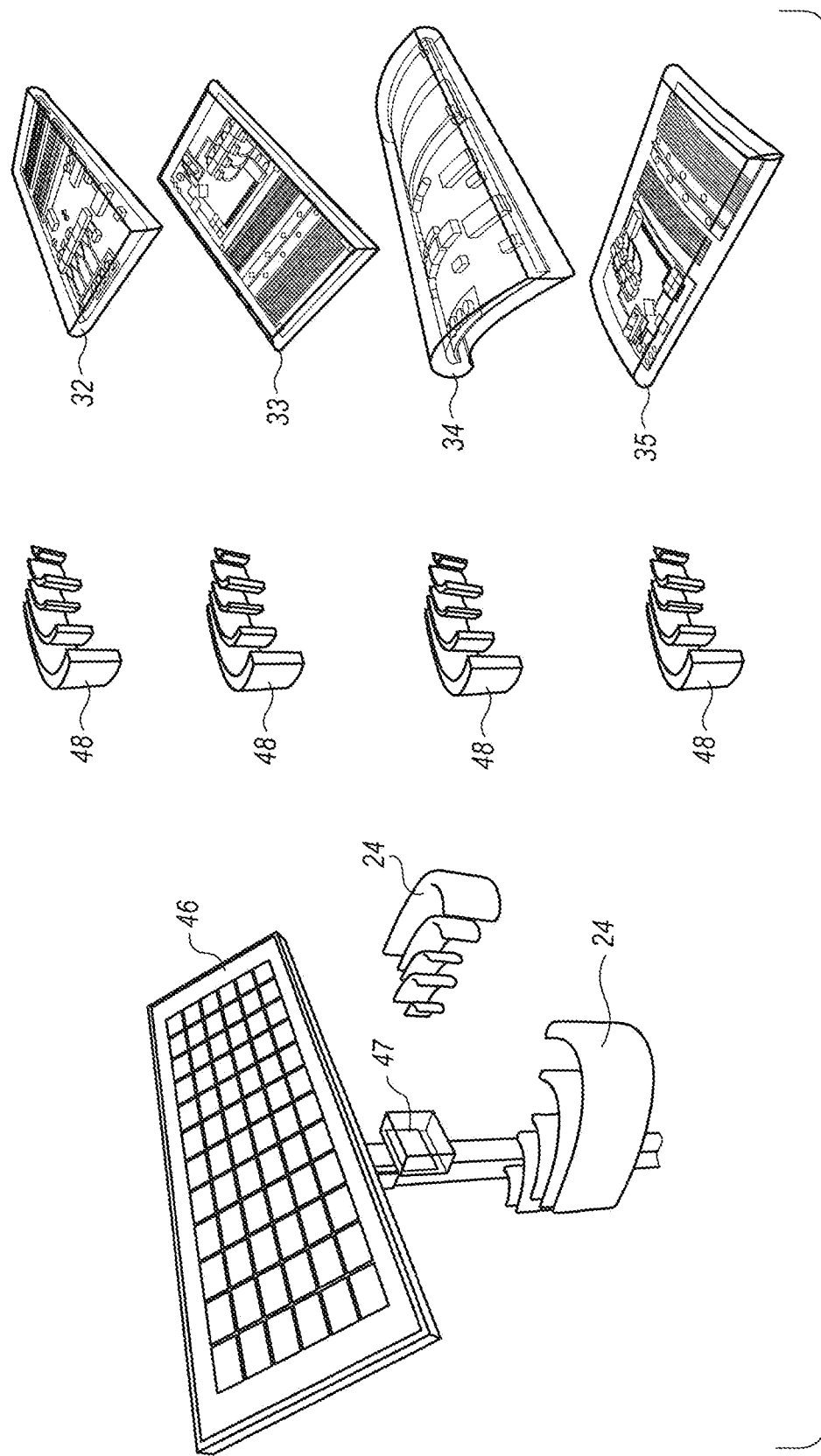
FIG. 9.—ECC releasing electromagnetic waves in an environment saturated with PES. The PES send back phenomena measurement using backscatter communication.
Figure 10:
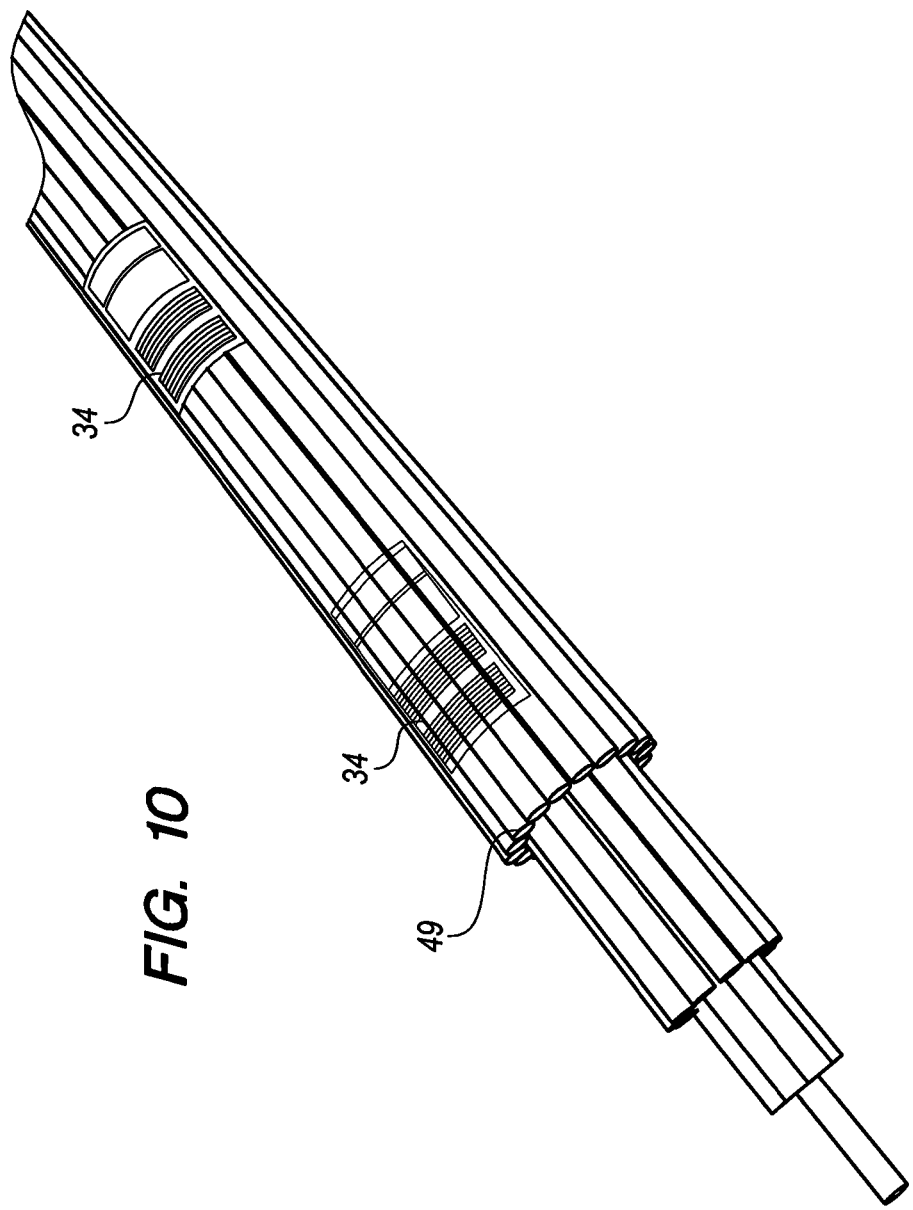
FIG. 10.—Aluminum Conductor Steel Reinforced (ACSR) power line used to transmit and distribute electrical energy from power generation stations to distribution stations to consumers. Curved PESs are attached to the ACSR wire as a manufactured component of the ACSR.
Figure 11:
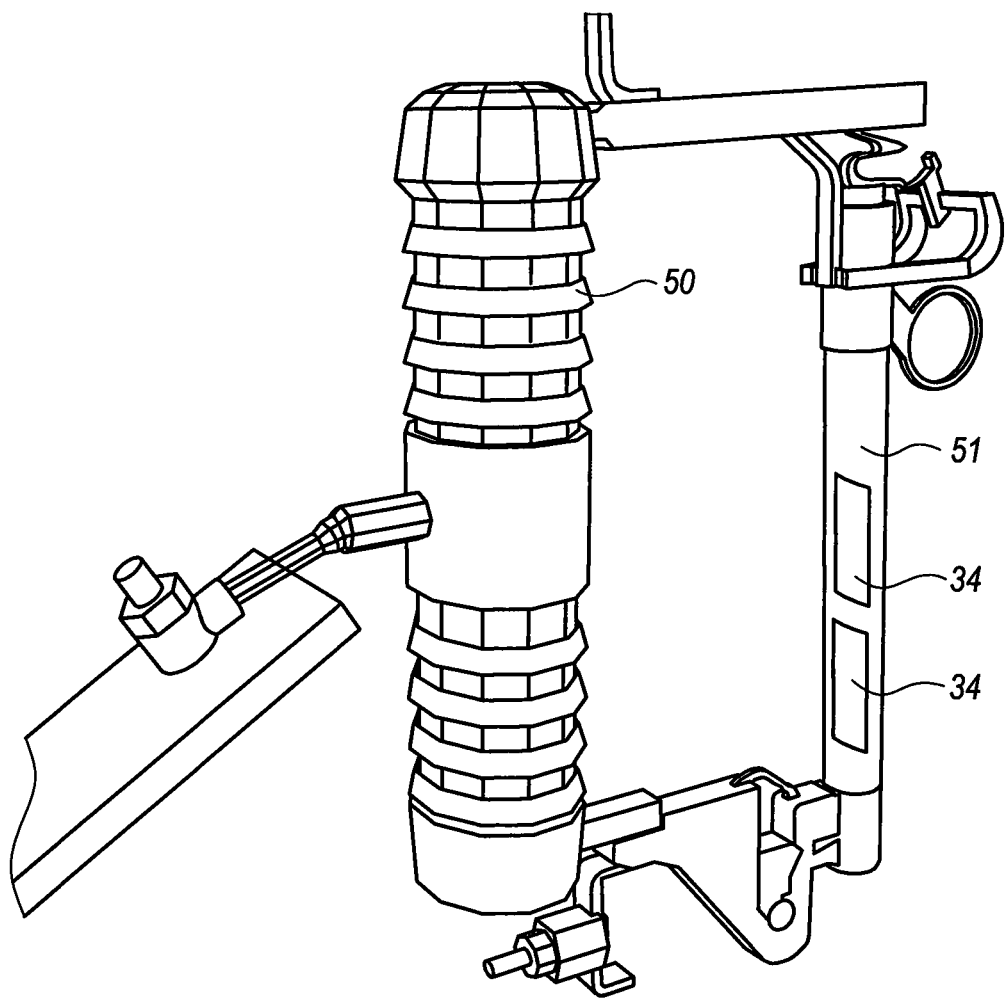
FIG. 11.—Cutout fuse is a combination of a fuse and a switch, used in primary overhead feeder lines and taps to protect distribution transformers from electrical surges and overloads. Curved PES are embedded as a component of the composite tube surrounding the fuse wire.
Figure 12:
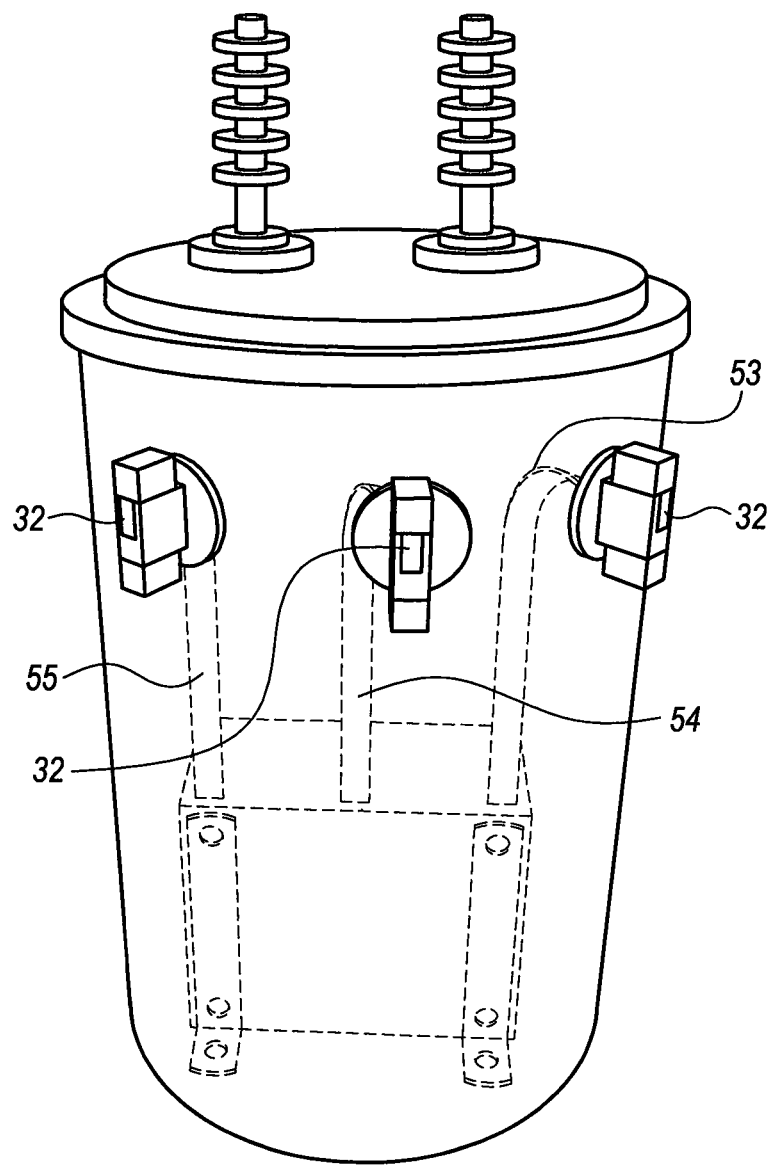
FIG. 12.—Pole mount transformers are distribution transformers that provides the final voltage transformation in the electric power distribution system, stepping down the voltage used in the distribution lines to the level used by the customer. Flat PESs are attached to each of the three phases of the transformer voltage.
Figure 21:
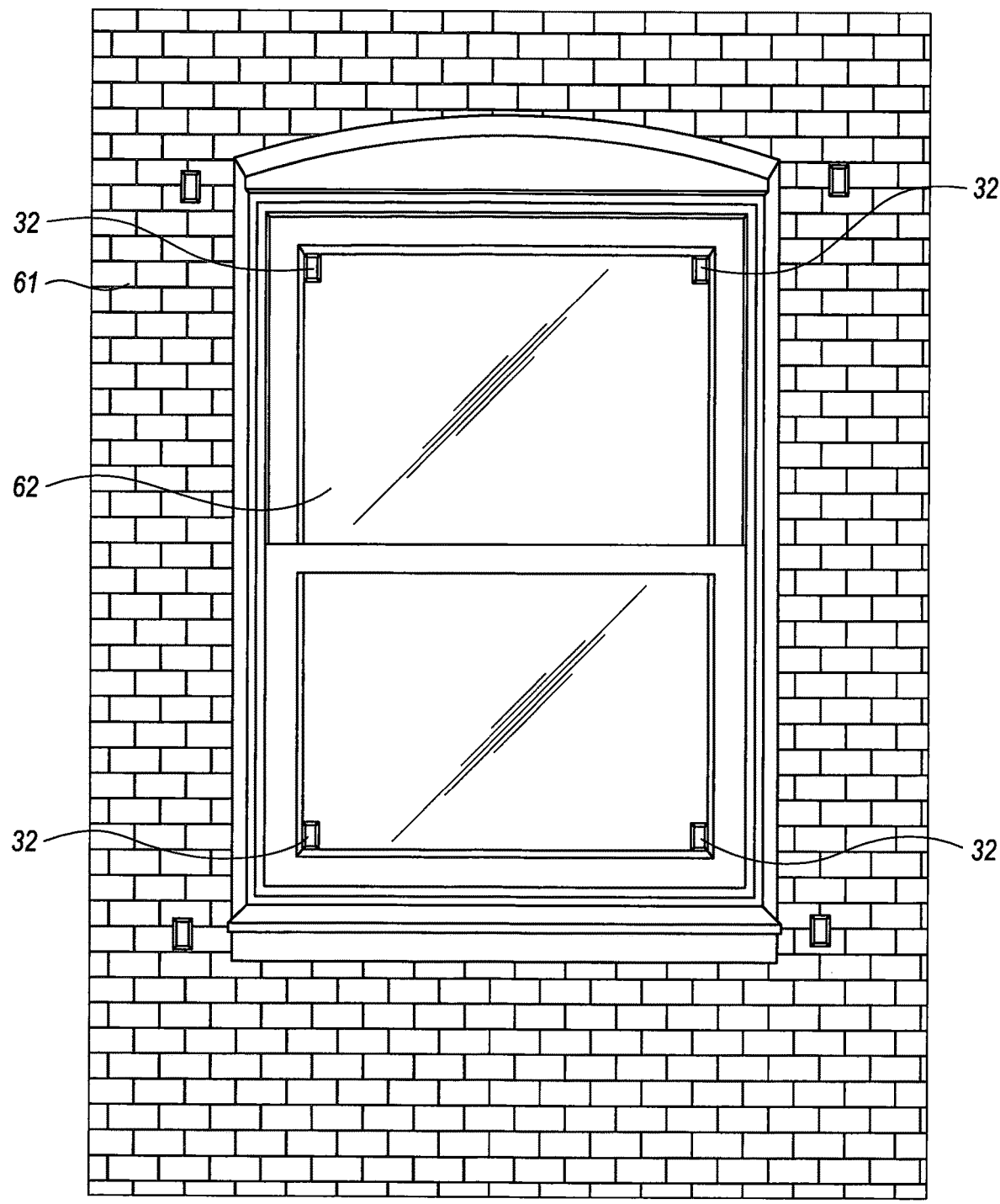
FIG. 21.—Building window and wall located in a municipality with ECCs located at various intervals. The ECC sits in an area saturated by PESs which are embedded as a manufactured component of windows, walls, doors, roofs, and other architectural components.
Figure 22:
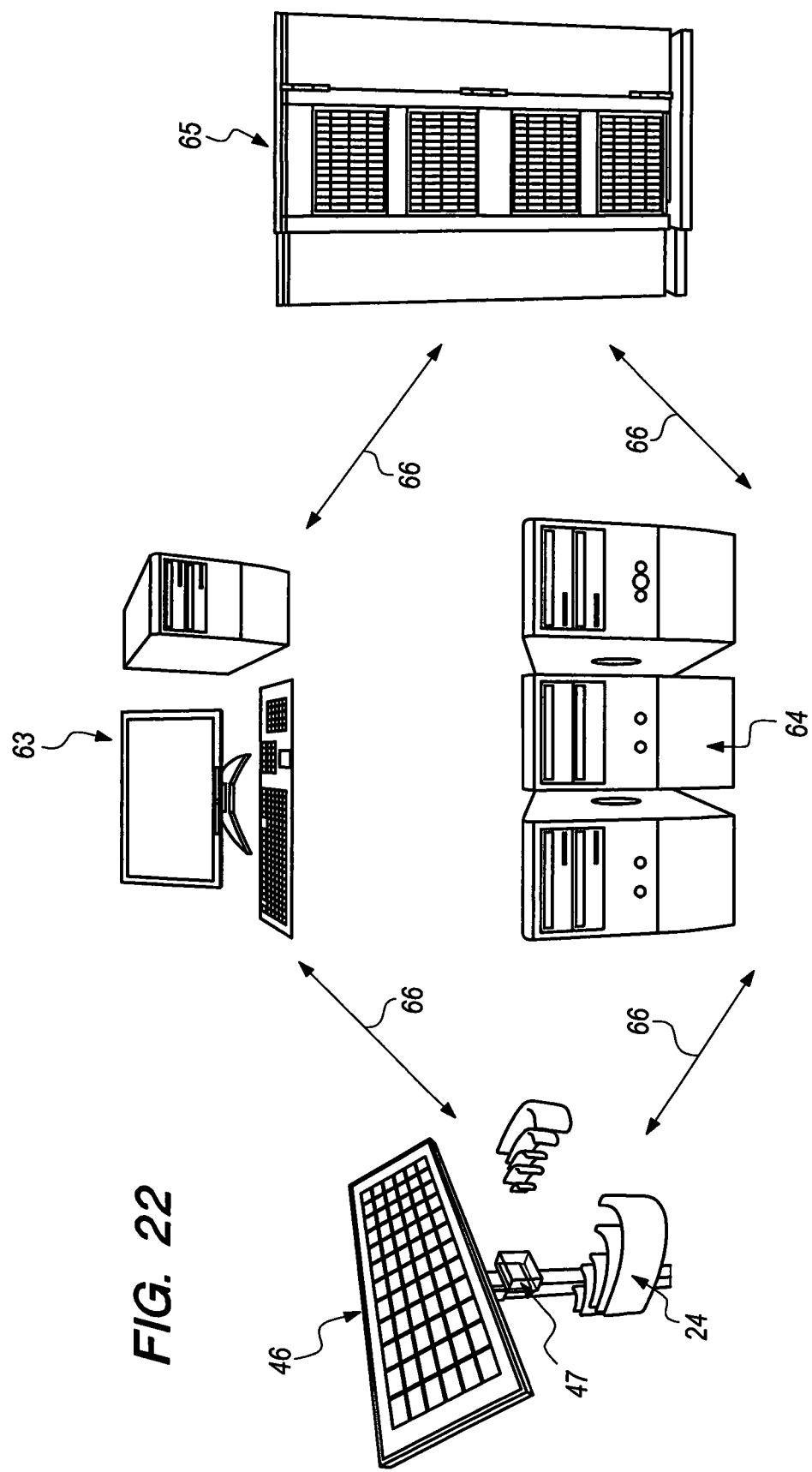
FIG. 22.—Peer to peer network composed of an ECC, a user computer, a distributed computing resource, and a supercomputer.

It should further be noted that the system is installed when PES are embedded or attached as a component in the manufacture of utility transmission and distribution hardware including ACSR conductor wire FIG. 10, fuses FIG. 11, transformers FIG. 12, switches, relays, circuit breakers, bus bars, capacitors, clamps, towers and poles, insulators, connectors, couplings, surge arrestors, stirrups, taps, regulation banks, suppressors, and street light covers. The system is installed when PESs are embedded or attached as a component in the manufacture of a company's liquid or gas pipeline distribution hardware such as pipe FIG. 15, pumps FIG. 16, and valves FIG. 17, etc. The system is installed when PESs are embedded or attached as a component in the manufacture of a municipalities lighting distribution hardware such as light covers, poles FIG. 19, or building environment hardware such as walls, windows etc. FIG. 21. These distribution hardware components serve as hosts for the sensors, which are physically separated from the ECC FIG. 9 and all other components. The ECC are physically separated from the user computer terminals. The ECC is physically separated from the super computer FIG. 22. The ECC are physically separated from distributed computational resources FIG. 22.

In order to make the PES capable of withstanding exposure to the elements for decades and make it capable of being installed as a component of distribution hardware where it will be crushed and abraded, it must be encased. One solution is to encase the passive electromagnetic sensor (PES) in a specialty glass pod 32-35. This solution is beneficial because the glass pod is inert to electrical energy, doesn't impede electromagnetic waves, can be made to reflect solar radiation, and dissipate heat. Glass does not conduct electricity, making it ideal for an electrical environment full of leaking voltage. The electromagnetic waves being generated by the ECC to power the PES are large enough to pass through the glass pod. The inside of the pod can be made opaque, eliminating solar radiations degradation of the PES. The inside of the pod can be made a vacuum filled with argon and so allow the PES to better dissipate heat. The glass pod can be curved to match the outside diameter of distribution hardware such as ACSR conductor wire, the curvature of a pipeline pump, valve or pipe. The PES pod can also be made so the delay gap tests in the AW part of the PES is open to the environment 27 & 30.

The PES pod 26-31 is manufactured on a glass sheet production line. Specialty glass, such as alkali-aluminosilicate glass, is used to increase the surface compression value of the glass and make it impervious to shock. These specialty glasses have completed an ion exchange process that creates an internal tension in the glass that imparts an ultra-high surface compression value. Such glass has a Vickers hardness test rating of 622 to 701. This hardness and surface compression value exceeding 10,000 lbs, per inch allows the encased PES to be installed as a manufactured component of distribution hardware using production machinery, where it may be crushed or abraded. This also allows the sensor a higher likelihood of not being destroyed as its host is installed in an electrical distribution grid, pipeline, municipal light grid, or on a building.

The inside of two separate curved sheets, top and bottom of the enclosure pod, are coated with synthetic silicone or some other non-conducting light-colored opaque material. The silicone coating is applied by charging the glass to 30,000 volts under specific heat conditions. A thin layer of silicone coats and fuses to the inside surface of the glass, making it white, and reduces the PES's exposure to solar radiation over decades of exposure. The synthetic silicone is non-conducting and does not interfere with the transmission of radio waves from the ambient environment to the vacuum sealed passive electromagnetic sensor or vice a versa.

On the glass sheet production line, an electromagnetic sensor is deposited on a wafer of curved specialty glass that has been coated with synthetic silicone to reduce exposure to solar radiation. The curve of the glass matches the outside diameter of a component of distribution hardware such as ACSR conductor wire FIG. 10, cut out fuse fiberglass tube 51 and wire, transformer bushing 82, etc. An epoxy layer may be applied to the top and bottom of the PES before a second sheet of specialty glass, coated on the inside, is used to cover the electromagnetic sensor. A trip through a series of progressively hotter flames softens the glass. A press then moves in to squash the four sides of the glass, encasing the electromagnetic passive sensor in the glass. At the same time the press makes a tiny hole in the glass chamber. Later in the production cycle, air is removed from the chamber, and replaced with argon gas through this vent hole 28 & 31.

Argon gas is an inert gas and resists heat build-up in the now enclosed PES pod. The vent hole is closed using flame, and the PES is sealed inside its pod in argon gas. In other embodiments, the pod can be made of non-conducting, ultra violet radiation blocking polymers, or porcelain ceramics. The adhesive can be various kinds of epoxies.

To manufacture PES equipped distribution hardware components, the completed PES pod 32 & 34 is placed in a magazine. As the outer layer of the ACSR conductor wire is spun around the steel core, a single component silicone adhesive is deposited ⅜" thick for the length of the pod, plus 10% on each end. In a second station, a mechanical arm attaches the curved pod along the long axis of the ACRS as it is reeling out. The process is executed in a humid environment, allowing for quick cure of the silicone-based adhesive that links the pod to the outer layer of metal. The ACSR is rolled onto spools as it normally is. Due to the nature of the glass pod and the curve of the pod, the pod is not crushed or destroyed as the ACSR is wound under tension.

In another embodiment, the attachment of the PES pod to the cutout fuse tube 52 is the same as for ACSR above. The PES pod is placed in a magazine. After the cutout fuse tube is cut to size, a single component silicone adhesive is deposited ⅜" thick for the length of the pod, plus 10% on each end. In a second station, a mechanical arm attaches the curved pod along the inside long axis of the cutout fuse tube. The process is executed in a humid environment, allowing for quick cure of the silicone-based adhesive that links the pod to the inside of the cutout tube. The cut-out tube continues in its manufacture process as normal. Due to the nature of the glass pod and the curve of the pod, the pod is not crushed or damaged when the cutout fuse wire is threaded through the fuse tube.

In yet another embodiment, the completed PES pod is placed in a magazine. As the complete transformer rolls down the production line, a single component silicone adhesive is deposited ⅜" thick for the length of the pod, plus 10% on each of the Wye or Delta bushing. In a second station, a mechanical arm attaches the curved pod along the inside long axis of the Wye or Delta bushing of the transformer. Due to the nature of the glass pod and the curve of the pod, the pod is not crushed or damaged when the complete transformer is packaged, transported, and installed.

It should also be noted that the complete PES pod can be installed manually post distribution hardware installation into the electrical transmission and distribution grid, pipeline system, or municipal light grid.

Figure 13:
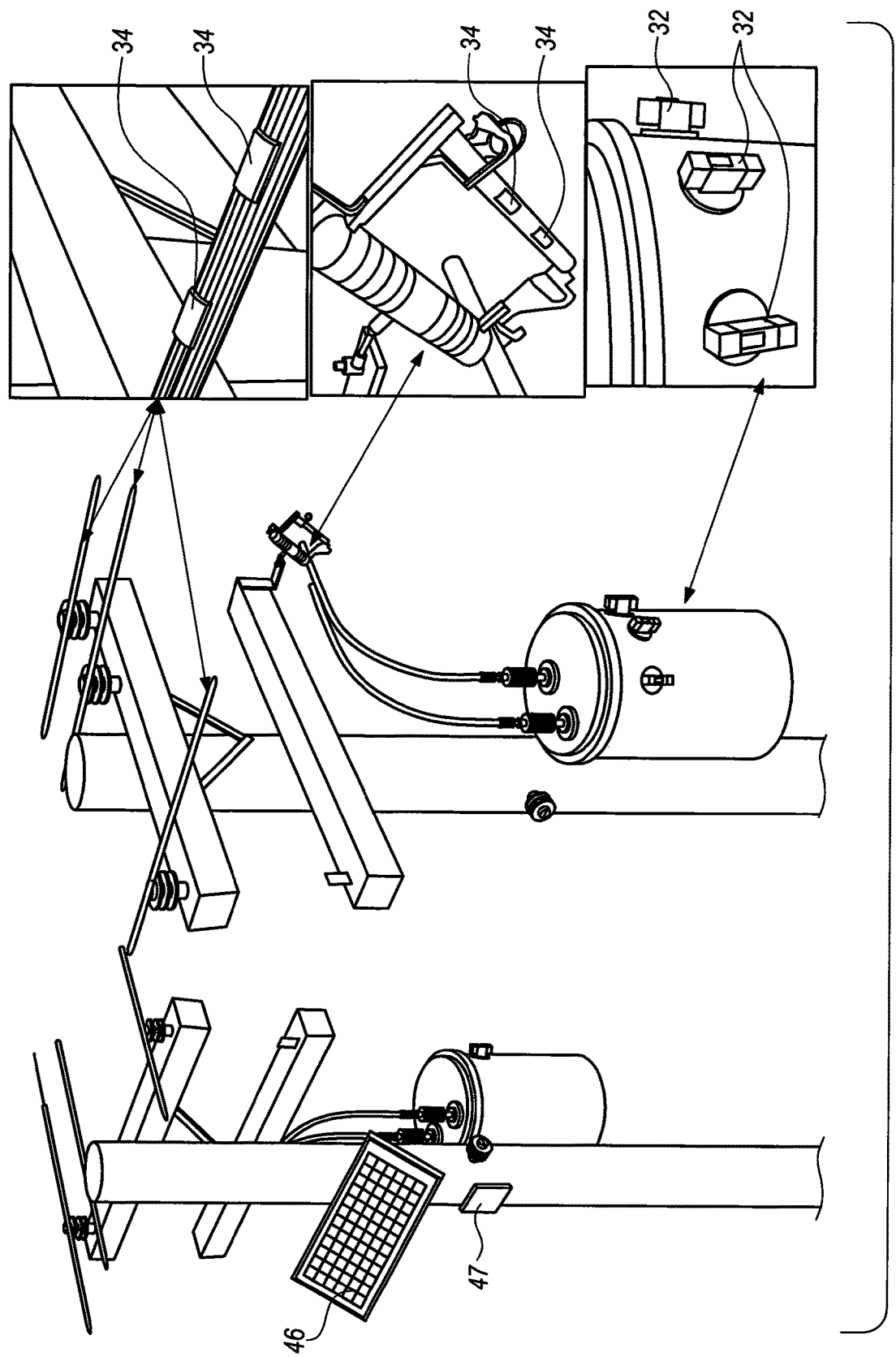
FIG. 13.—A utility's distribution power pole with ACSR, Cutout fuse, and transformer of a type that represents millions of units in the United States. The distribution power pole has a ECC and the ECC's solar array on the side opposite of the transformer.
Figure 18:
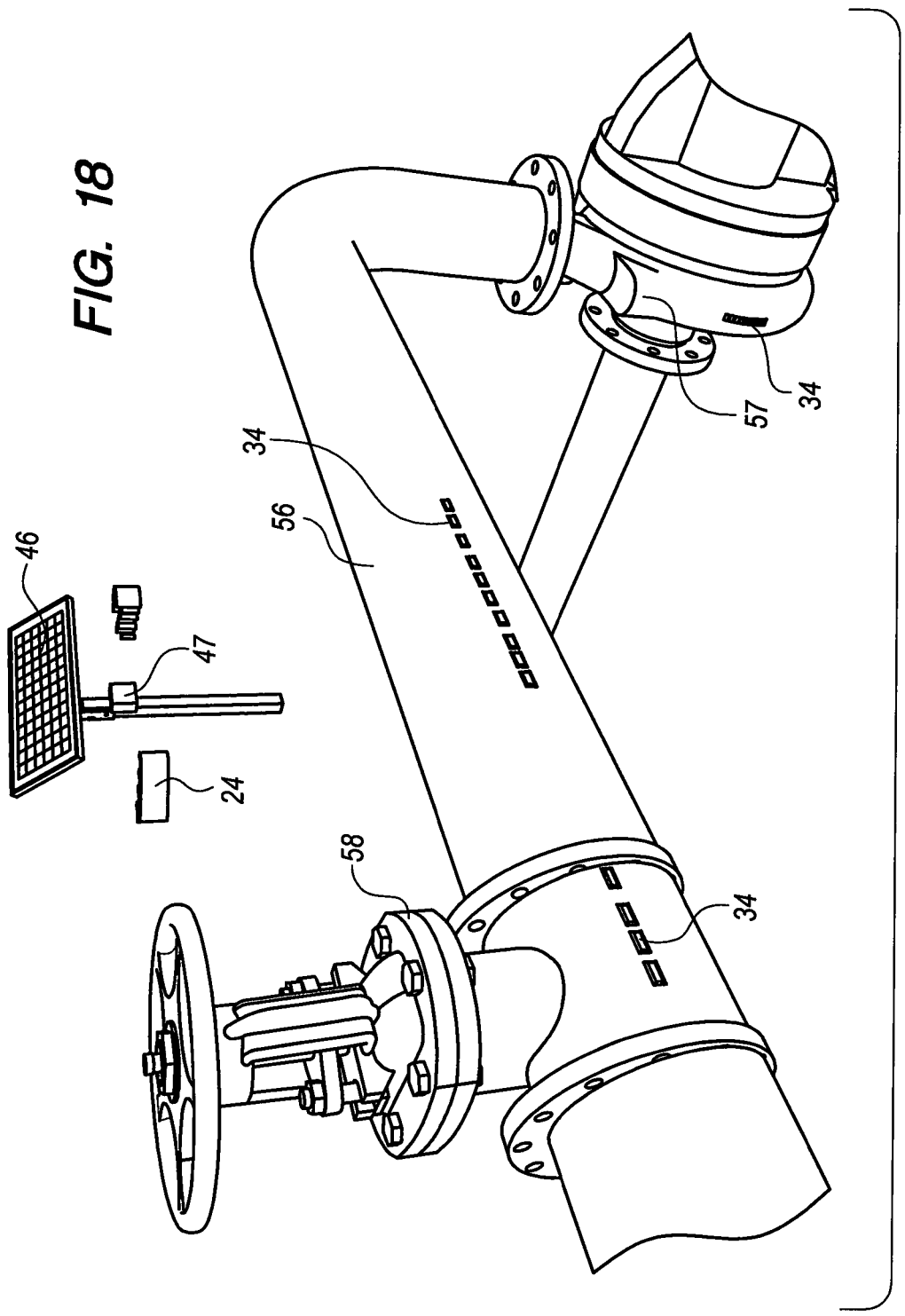
FIG. 18.—A company's oil and gas pipeline with ECCs located at various intervals. The ECC sits in an area saturated by PESs which are embedded as a manufactured component of the pipe, pumps, and valves.
Figure 20:
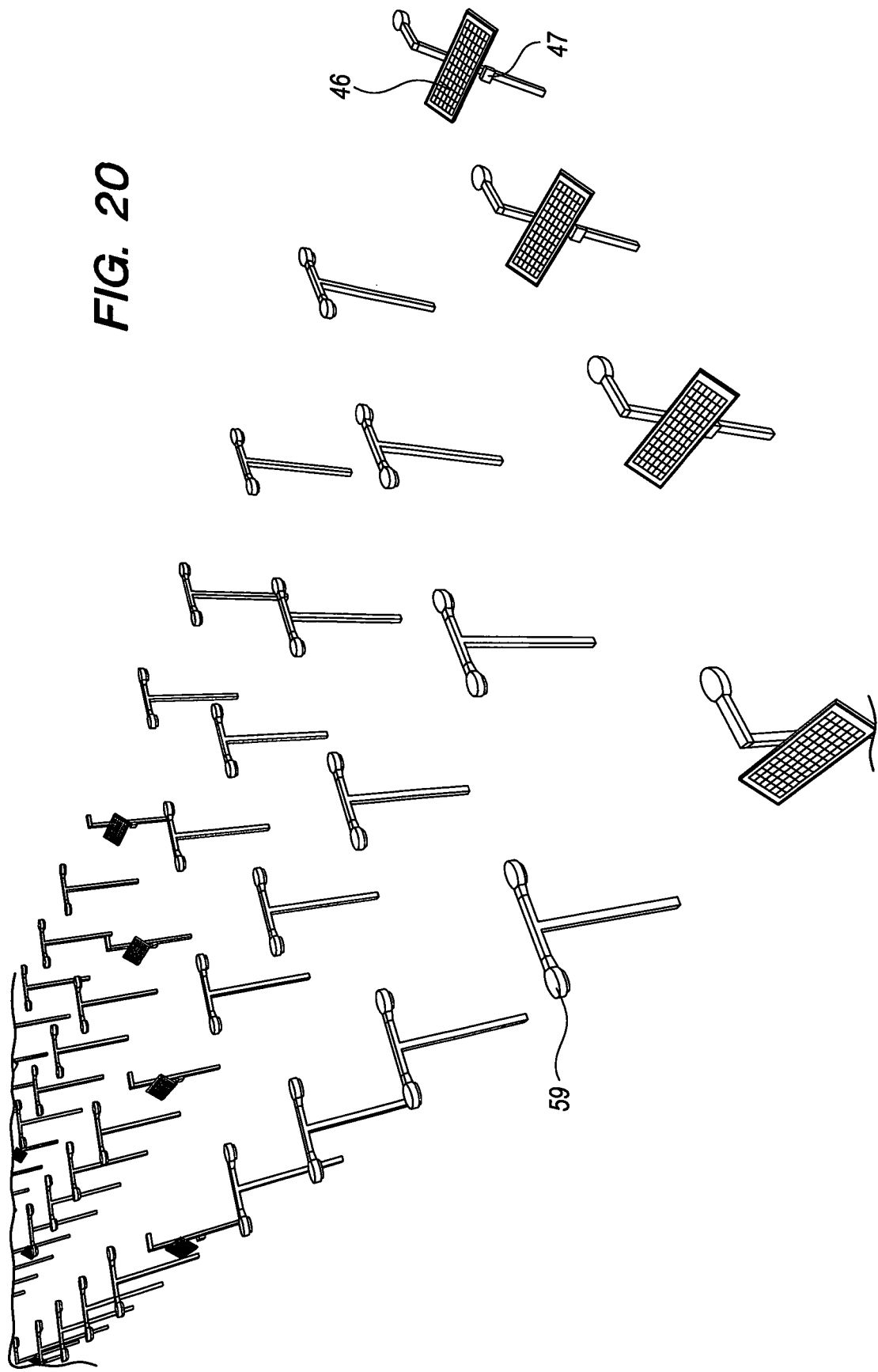
FIG. 20.—A municipality's street light grid with ECCs located every fifth light. The ECC sits in an area saturated by PESs which are embedded as a manufactured component of the light fixtures.

In a preferred embodiment, a method of enabling process control and predictive maintenance associated with the disclosed device comprises the following steps:

The wireless network system functions as the distribution hardware serving as host devices (ACSR conductor wire FIG. 10, Fuses FIG. 11, transformers FIG. 12, gas pipeline pipe FIG. 15, gas pipeline pump FIG. 16, gas pipeline valve FIG. 17, street light assembly FIG. 19, Building component FIG. 21) are installed in the utility's electrical transmission and distribution grid FIG. 13, the company's liquid or gas pipeline FIG. 18, or the municipality's light grid FIG. 20 and building environment FIG. 21 as part of maintenance or upgrade. Similarly, the ECC's are mounted throughout the utility grid FIG. 14, and/or pipeline FIG. 18, and/or municipal light grid FIG. 20 or building environment. Upon installation, the ECC FIG. 8 begins generating and emitting one or more electromagnetic waves 24 through its transceiver 38 and antenna 36. The acoustic wave (AW) sensor FIG. 3, 32-35 both embedded and attached, is activated when it receives electromagnetic waves in a frequency corresponding to its Input Interdigital Transducer (IDT) 3. AW sensor FIG. 1 harvests the electromagnetic waves by passing the electromagnetic energy through its interdigital transducers 3. The pulse is converted into an AW on the sensor using the piezoelectric effect. The amplitude, frequency, phase, and period properties of the AW are modified by being forced to travel over films 4, barriers 5, gates 6, gratings 2 & 8 in the delay gap on the acoustic wave chip FIG. 1. These gap tests are designed to modify the acoustic wave based on the phenomena being measured. The modified acoustic wave is changed back from an acoustic wave to an electromagnetic wave by the outbound IDT 7, which passes the electromagnetic wave to the demodulator on the microprocessor on the PES FIG. 2. If the PES doesn't have a central processing unit, the modified acoustic wave is broadcast to the ECC using backscatter communication. The microprocessor onboard the PES is also activated when it receives electromagnetic waves 24 corresponding to its antenna frequency. The electromagnetic waves cause the electrons in the microprocessor's antenna 12 to create alternating current 13, governed by Maxwell's equations. Diodes located in the power harvester 15,17, 19, 21 allow current to pass in a single direction, converting the antenna's alternating current into direct current. The direct current created is stored by capacitors 16, 18, 20, 22. The voltage regulator 23 manages voltage conditions until acceptable voltage is achieved. The voltage supervisor manages the upper and lower voltage limits acceptable for the microprocessor, making it capable of computational analysis. The CPU 9 receives the modified acoustic wave from the outbound IDT 7 of the FIG. 1. Using programming logic, the microprocessor processes the modified characteristics of the AW and computes a value for the phenomena. The microprocessor logic causes transistor(s) in the antenna 12 to switch, changing the reflection coefficient of the antenna. The modulator 11 varies the properties of a electromagnetic waveform, called the carrier signal, with a modulating signal that contains the computed phenomena measurement, which is then transmitted back to the ECC. This allows the PES to send data back to the ECC as a reflection of the RF source signal, called backscatter communication. Backscatter communication reduces the power required to operate the PES. Multiple PESs form a peer-to-peer network (P2P) and may also act as a repeater for PES sensors more distant from the Electromagnetic Controller Communicator (ECC) FIG. 8.

Figure 14:
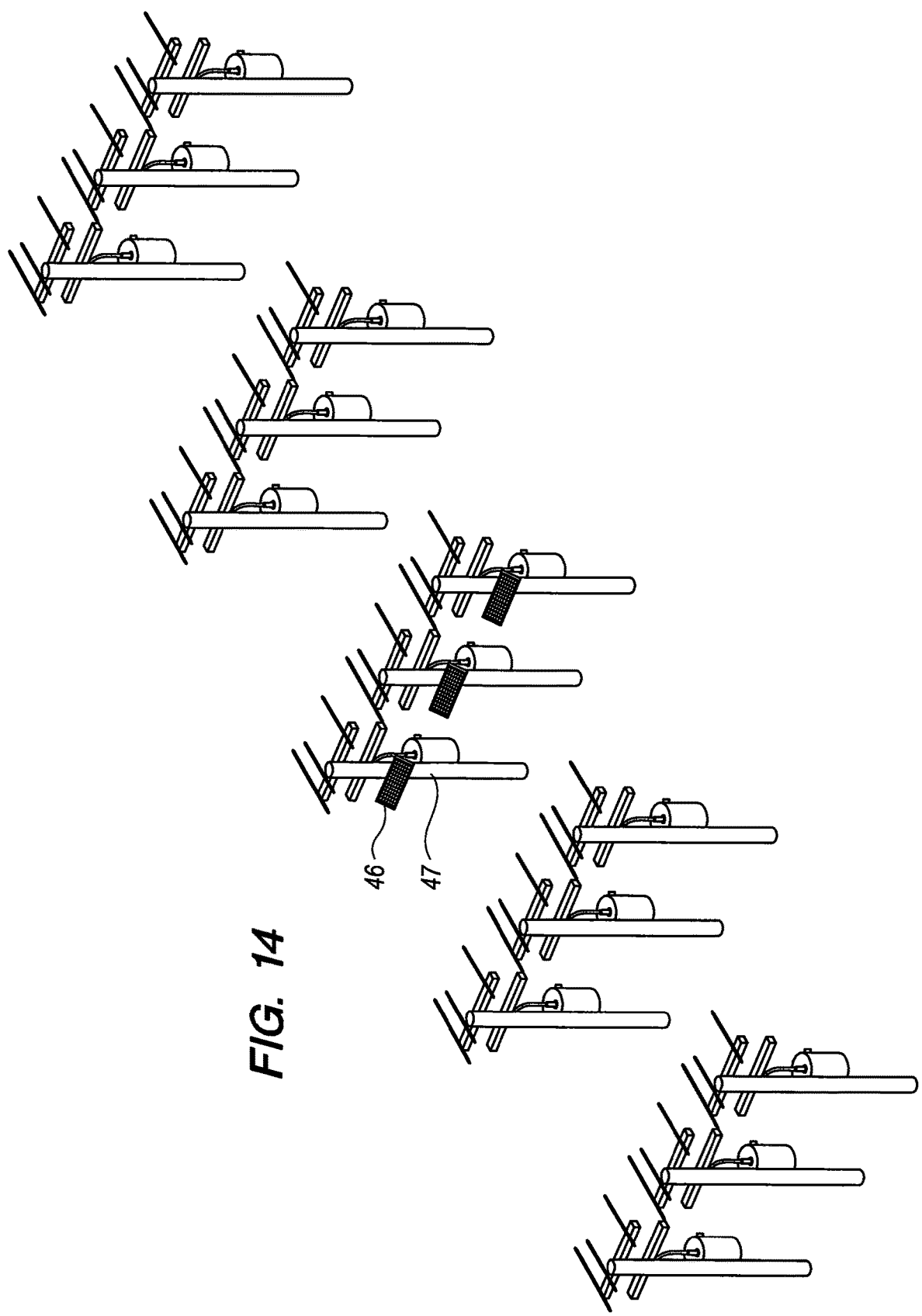
FIG. 14.—A utilities electrical distribution grid with an ECC located at one in 5 power poles. The ECC sits in an area saturated by PESs which are embedded as a manufactured component of the ACSR power line, cutout fuses and transformers.

The ECC are placed on power poles FIG. 14, in pipeline areas FIG. 18, on municipality lighting poles FIG. 20, or other appropriate locations within range of the PESs. The transceiver 38 onboard the ECC FIG. 8 begins to emit one or more Radio-Frequency (RF) pulses on a fixed cycle. The PES' harvest the Radio-Frequency (RF) pulses attuned to its IDT and antenna 3 and returns phenomena measurement information through its modulator and antenna 14. The CPU onboard the ECC uses algorithms, programming logic and a mapping module to map the identity, location and phenomena type and data of each uniquely identified PES. As the ECC FIG. 8 receives and processes phenomena data from unique PES, it checks the data against (1) a relational module containing normal patterns for that type of PES, (2) a relational module containing anomalous phenomena measurement value associated with an alarm condition for that type of PES, (3) a relational module for comparing the real-time phenomena patterns against hardware failure patterns for that type of PES, and (4) a relational module for comparing the real-time voltage frequency from voltage PESs near the ECC in order to compute local modes of oscillation. The processor and programming logic onboard the ECC add the real-time phenomena information provided by each PES to the mapping module to create a structural utility grid monitor with a wellness pattern by combining damage detection algorithms with a structural monitoring system with a local modes of oscillation models. The programming logic stored on the data storage device 42 onboard the ECC FIG. 8 can cause the ECC to issue an alarm or issue an execution command to another machine in the peer-to-peer network (P2P) 66. This occurs when anomalous phenomena patterns are matched, and the matched pattern has a command action sequence prescribed by an algorithm or programming logic. Such commands can be used to terminate, divert, add or subtract electrical power to any segment of the utility grid for which the peer-to-peer network (P2P) has permission. The CPU 41 causes the communication device onboard the ECC 44 to communicate measurement of phenomena, alarms, commands, and wellness maps for the vicinity of the ECC over a communication connection in an encrypted format. The ECC is powered by a photovoltaic solar array 46.

The user computers(s) have four functions: (1) inputs maintenance records of equipment faults, reduction of capacity, and other anomalous conditions for use by the super computer to create correlations with PES measurement data, (2) receive sensor information, alarms, machine to machine orders, and utility grid wellness maps, and (3) process user enquiries about the utility grids wellness, alarms, current situation, etc. (4) serves as distributed processing capability for the network.

This wireless sensor system acts as a peer to peer network (P2P) where the programming logic onboard the PES causes the system to create a block in a blockchain transaction for each measured phenomena 67. A unique PES requests a transaction as a member of the wireless sensor system peer to peer network (P2P) 66. The network, consisting of multiple PES', ECCs, multiple user computers, distributed computing resources, and one or more supercomputers, verifies the requesting PES's identity and status using algorithms. Once verified, the PES can communicate phenomena information as blocks in a blockchain 68. The PES' microprocessor causes the PES to communicate the blockchain transaction to the peer to peer network (P2P). This method allows for both local and distributed security and verification phenomena data as trustworthy.

Peer to peer network (P2P) 66 is also achieved by the programming logic stored on the data storage device 42 onboard the ECC FIG. 8 and processed by the CPU 41, which causes the system to create a block in a blockchain transaction for each alarm, order, map, and transmission of all measured phenomena FIG. 12. A unique Electromagnetic Controller Communicator (ECC) requests a transaction as a member of the wireless sensor system peer to peer network (P2P) 68. The network, consisting of multiple Electromagnetic Controller Communicator (ECC), multiple user terminals, distributed computing resources, and one or more supercomputers FIG. 22, verifies the requesting ECC's identity and status FIG. 22 using algorithms. Once verified, the ECC can issue a phenomena alarm, can issue a hardware failure alarm, can create and transmit a real-time wellness maps, can create and transmit real-time patterns, can create and transmit real-time local area oscillation information, and can issue execution commands to other machines as blocks in a blockchain 68. The programming logic stored on the data storage device 42 onboard the ECC FIG. 8 causes the system to communicate the blockchain transaction to the peer to peer network (P2P) 66, including the supercomputer 65. This method allows for both local and distributed security and verification of structural health monitor maps, reports, alarms, and orders for the utility electrical grid.

The wireless sensor system sends its information to a supercomputer housing artificial intelligence 65 means. The artificial intelligence uses this data and information to explain, demonstrate and advise users on the utility grid's real-time wellness. The artificial intelligence also receives maintenance records of equipment faults, reduction of capacity, and other anomalous conditions from user terminals. The artificial intelligence and distributed computing resources create correlations between anomalous sensor readings and incipient failures, failures, faults, interrupts of service. The AI uses these correlations to learn, improve and finally predict incipient failures, failures, faults, interrupts of service. This allows the IOU or coop to move from preventive to predictive maintenance. The AI also uses these correlations to create more accurate normal and anomalous phenomena patterns for type of host device (ACSR conductor wire FIG. 10, Fuses FIG. 11, transformers FIG. 12, gas pipeline pipe FIG. 15, gas pipeline pump FIG. 16, gas pipeline valve FIG. 17, street light assembly FIG. 19, Building component FIG. 21) and each ECC's individual environment. The artificial intelligence causes new algorithms and databases to be created, transmitted and uploaded to the Electromagnetic Controller Communicator (ECC), resulting in wellness models becoming more accurate and predictive. Over time, the wellness model becomes accurate enough to transition the utility from preventive to predictive maintenance for the utility grid.

Figure 24:
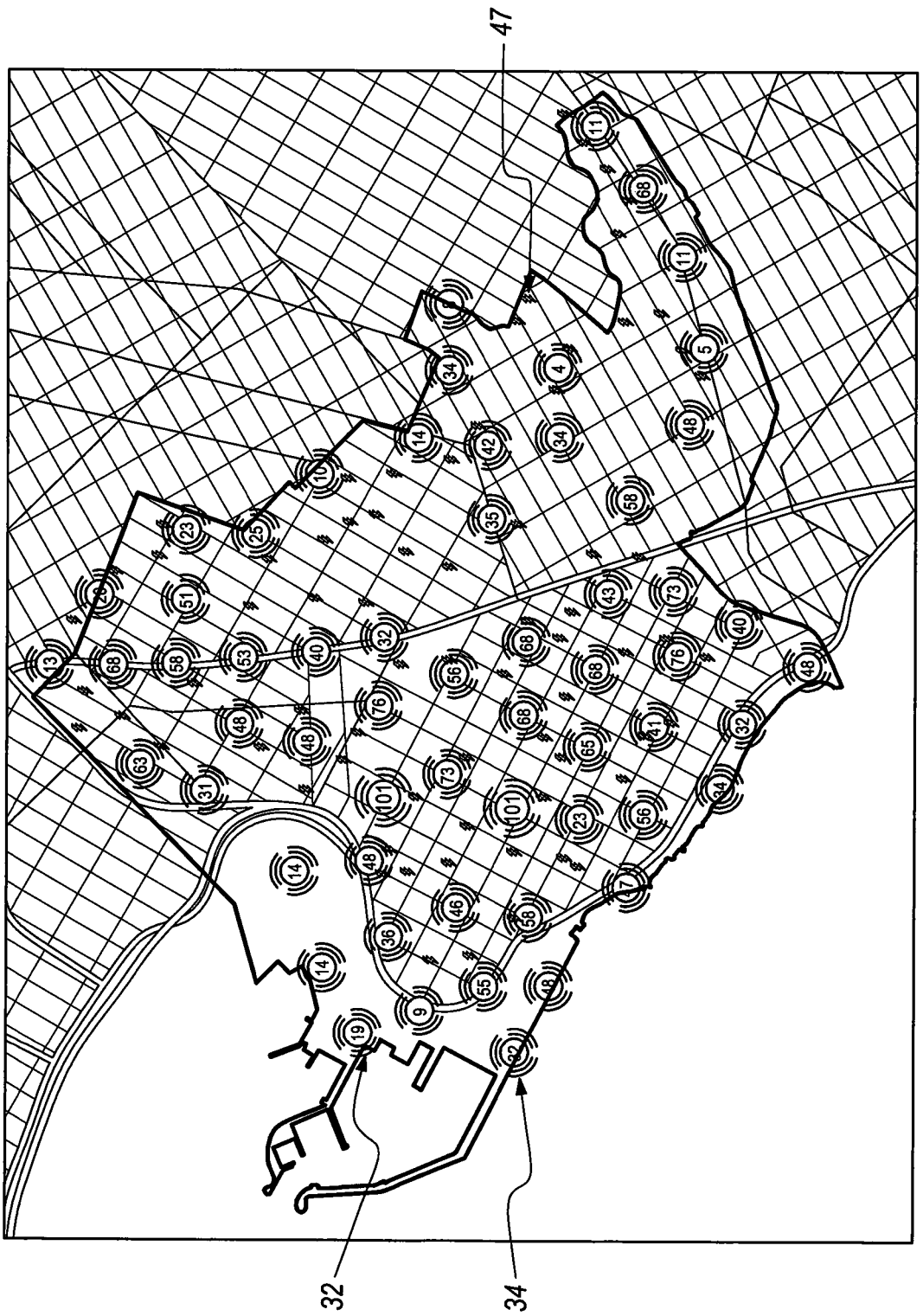
FIG. 24.—a municipal's IOT network of ECC's and PES with real-time monitoring, alarms, orders, and wellness data. The invention moves the IOU, CU, or municipality from preventive to predictive action.

The wireless sensor system sends its information to one or more supercomputers housing an artificial intelligence (AI) 65 means. The artificial intelligence (AI) combines regional wellness and safety maps into an overall utility structural health monitor of the entire utility electrical grid FIG. 24. This information allows an automated method for tracking and improving the health and structure of a utilities transmission and distribution grid by combining damage detection algorithms with a structural monitoring system. The health monitor improves over time as the system learns.

The wireless sensor system simultaneously measures voltage waveform (frequency) at tens, hundreds, and thousands of points on the utility transmission and distribution grid to determine local and inter-area oscillation of voltage waveforms. These simultaneous voltage phase frequency measurements are sent to one or more supercomputers housing an artificial intelligence (AI) 65 means. The artificial intelligence (AI) creates an overall utility grid monitoring system for the measurement of local and inter-area oscillation of voltage frequency which can cause cascading utility grid failures. The local and inter-area oscillation monitoring improves over time as the system grows larger and creates strategies for dampening oscillations through the injection of voltage using energy storage devices.

In another embodiment, the artificial intelligence (AI) combines sector indoor and outdoor breathable air wellness and safety maps into an overall municipality outdoor breathable air wellness and safety maps. This information allows an automated method for tracking and measuring the presence of pollutants in a municipality's breathable air. Breathable air wellness and safety maps improve over time as the system learns. The AI system creates correlations between weather, industrial activity, government activity, and other factors to move the municipality from reactive to predictive. Predictive knowledge allows the municipality to create policies that improve the indoor and outdoor breathable air quality, and measure the improvement using the device.

This wireless sensor system, acting as a peer to peer network (P2P), is also used by pipelines carrying oil and gas, water, ammonia, alcohol, hydrogen, steam, or any other gas or liquid. The wireless multi sensor network that comprises a plurality of electromagnetic passive sensors are embedded as a manufactured internal component of a mechanical device used in pipelines such as pipe FIG. 15, pumps FIG. 16, valves FIG. 17.

This wireless sensor system, acting as a peer to peer network (P2P), is also used as part of a computer ethernet or fiber optic network in the transmission of internet protocol data packets. The wireless multi sensor network that comprises a plurality of passive electromagnetic sensors, may be embedded as a manufactured internal component of a mechanical device used in computer networks such as cable, WiFi routers, switches, wired routers, network interface cards, computer motherboards, ports, busses, hubs, fittings, jacks, plugs and connections. In addition to the phenomena listed above, these sensors could be made to measure voltage, current, flow rate.

This wireless sensor system, acting as a peer to peer network (P2P), is also used by national security entities seeking to monitor nuclear, chemical and biological threats to a municipality's outdoor breathable air. The wireless multi sensor network that comprises a plurality of passive electromagnetic sensors are attached to or embedded as a manufactured internal component of a municipality's lighting grid or a utilities transmission and distribution grid. Detection of NBC pollutants may trigger alarms and orders associated with anomalous conditions.

As discussed, the invention has many different features, variations and multiple different embodiments. The invention has been described in this application at times in terms of specific embodiments for illustrative purposes and without the intent to limit or suggest that the invention conceived is only one particular embodiment. It is to be understood that the invention is not limited to any single specific embodiments or enumerated variations. Many modifications, variations and other embodiments of the invention will come to mind of those skilled in the art to which this invention pertains, and which are intended to be and are covered by both this disclosure. It is indeed intended that the scope of the invention should be determined by proper interpretation and construction of the disclosure, including equivalents, as understood by those of skill in the art relying upon the complete disclosure at the time of filing.

What is claimed is:

1. A method of computing a phenomena value from a modified acoustic wave, comprising steps of:
   a. an electromagnetic controller communicator emitting an electromagnetic wave where said electromagnetic wave is captured by an inbound interdigital transducer located on a passive electromagnetic sensor;
b. wherein said interdigital transducer converts said electromagnetic wave to an acoustic wave, which travels along a propagation path;
c. wherein said acoustic wave passes through a test delay gap and is modified based on a presence of a phenomena to create the modified acoustic wave;
d. wherein said modified acoustic wave passes through an outbound interdigital transducer and is reflected back to said electromagnetic controller communicator for computation of said phenomena value from said modified acoustic wave;
wherein said electromagnetic controller communicator compares said computed phenomena value from said modified acoustic wave to a set of normal and anomalous values to determine if said computed phenomena value from said modified acoustic wave represents an anomalous condition; and
wherein the electromagnetic controller communicator issues execution commands to other machines of a utility grid, wherein said execution commands comprise terminating, diverting, adding, or subtracting electrical power to any segment of said utility grid.

2. A method of computing a phenomena value from a modified acoustic wave, comprising steps of:
a. a first electromagnetic controller communicator of a plurality of electromagnetic controller communicators emitting an electromagnetic wave where said electromagnetic wave is captured by an inbound interdigital transducer located on a passive electromagnetic sensor;
b. wherein said inbound interdigital transducer converts said electromagnetic wave to an acoustic wave, which travels along a propagation path;
c. wherein said acoustic wave passes through a test delay gap and is modified based on a presence of a phenomena to create the modified acoustic wave;
d. wherein said modified acoustic wave is analyzed by an onboard microprocessor of said passive electromagnetic sensor, where said microprocessor computes the phenomena value from said modified acoustic wave;
e. transmitting said phenomena value to a network, wherein the network includes: a plurality of passive electromagnetic sensors; a plurality of electromagnetic controller communicators; at least one user computing resource or at least one user computer; and at least one supercomputer with artificial intelligence means, whereby at least one of the plurality of electromagnetic controller communicators of whereby said network processes said phenomena value and determines whether said phenomena value is anomalous by comparison of said phenomena value with a known relational module wherein the artificial intelligence means is configured to learn phenomena patterns representing normal and anomalous conditions at least based on previous phenomena measurement values measured by the plurality of passive electromagnetic sensors and to generate the relational module for determining an anomalous condition wherein said network issues execution commands to any segment of a utility grid; and
f. whereby programming logic of said network enables process control and predictive maintenance commands based on said comparison of said phenomena value with said known relational module to maintain wellness of said utility grid.

3. The method of computing the phenomena value from the modified acoustic wave of claim 2 wherein said phenomena value from said modified acoustic wave is transmitted back to said first electromagnetic controller communicator.

4. The method of computing the phenomena value from the modified acoustic wave of claim 3 further comprising a step of said first electromagnetic controller communicator communicating said phenomena value from said modified acoustic wave to a grid monitoring system.

5. The method of computing the phenomena value from the modified acoustic wave of claim 4 wherein said first electromagnetic controller communicator compares said computed phenomena value from said modified acoustic wave to a set of normal and anomalous values to determine if said computed phenomena value from said modified acoustic wave represents an anomalous condition.

6. The method of computing the phenomena value from the modified acoustic wave of claim 5 further comprising a step of said first electromagnetic controller communicator executing preprogrammed orders based on a finding of said anomalous condition.

7. A method of utilizing modified acoustic waves to enable process control and predictive maintenance comprising steps of:
a. harvesting of a first electromagnetic wave by a passive electromagnetic sensor;
b. converting said electromagnetic wave to an acoustic wave;
c. modifying said acoustic wave based on a phenomena to be measured to create a first modified acoustic wave;
d. transmitting said first modified acoustic wave to a microprocessor of said passive electromagnetic sensor or an electromagnetic controller communicator;
e. whereby said microprocessor or electromagnetic controller communicator computes a first value for said phenomena to be measured from said first modified acoustic wave;
f. transmitting said first value to a network, wherein the network includes: a plurality of passive electromagnetic sensors; a plurality of electromagnetic controller communicators; at least one user computing resource or at least one user computer; and at least one supercomputer with artificial intelligence means, whereby at least one of the electromagnetic controller communicators of whereby said network processes said first value and determines whether said value is anomalous by comparison of said first value with a known relational module wherein the artificial intelligence means is configured to learn phenomena patterns representing normal and anomalous conditions at least based on phenomena measurement values measured by the plurality of passive electromagnetic sensors and to generate the relational module for determining a first anomalous condition wherein said network issues execution commands to any segment of a utility grid; and
g. whereby programming logic of said network enables process control and predictive maintenance commands based on said comparison of said first value with said known relational module to maintain wellness of said utility grid.

* * * * *